(12) United States Patent
Ravid et al.

(10) Patent No.: US 11,637,557 B2
(45) Date of Patent: *Apr. 25, 2023

(54) SYNTHESIZED CLOCK SYNCHRONIZATION BETWEEN NETWORK DEVICES

(71) Applicant: MELLANOX TECHNOLOGIES, LTD., Yokneam (IL)

(72) Inventors: Ran Ravid, Tel Aviv (IL); Aviv Berg, Beit Keshet (IL); Lavi Koch, Tel Aviv (IL); Chen Gaist, Tel Aviv (IL); Dotan David Levi, Kiryat Motzkin (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 17/670,540

(22) Filed: Feb. 14, 2022

(65) Prior Publication Data
US 2022/0173741 A1    Jun. 2, 2022

Related U.S. Application Data

(63) Continuation of application No. 16/920,772, filed on Jul. 6, 2020, now Pat. No. 11,283,454, which is a
(Continued)

(51) Int. Cl.
*H03L 7/08* (2006.01)
*G06F 1/12* (2006.01)
(Continued)

(52) U.S. Cl.
CPC .............. *H03L 7/0807* (2013.01); *G06F 1/12* (2013.01); *H03L 7/099* (2013.01); *H04L 7/033* (2013.01)

(58) Field of Classification Search
CPC ......... H03L 7/0807; H03L 7/099; G06F 1/12; H04L 7/033
See application file for complete search history.

(56) References Cited

U.S. PATENT DOCUMENTS 5,392,421 A    2/1995  Lennartsson
5,402,394 A    3/1995  Turski
(Continued)

FOREIGN PATENT DOCUMENTS

CN    106817183 A    6/2017
CN    108829493 A    11/2018
(Continued)

OTHER PUBLICATIONS

EP Application #22151451.6 Search Report dated Jun. 17, 2022.
(Continued)

*Primary Examiner* — Deepa Belur
(74) *Attorney, Agent, or Firm* — Kligler & Associates Patent Attorneys Ltd

(57) ABSTRACT

In one embodiment, a device includes frequency generation circuitry configured to generate a clock signal, a phase-locked loop (PLL) configured to generate a local clock based on the clock signal, a receiver configured to receive a data stream from a remote clock source and recover a remote clock from the data stream, and a controller configured to find a clock differential between the local clock and the remote clock identified as a master dock, and provide a control signal to the frequency generation circuitry responsively to the clock differential, which causes the frequency generation circuitry to adjust the clock signal so as to iteratively reduce an absolute value of the clock differential between the local clock and the remote clock identified as the master clock so that the local clock generated by the PLL is synchronized with the master clock.

19 Claims, 15 Drawing Sheets

Related U.S. Application Data continuation-in-part of application No. 16/199,312, filed on Nov. 26, 2018, now Pat. No. 10,778,406.

(60) Provisional application No. 62/994,900, filed on Mar. 26, 2020.

(51) Int. Cl.
   *H04L 7/033* (2006.01)
   *H03L 7/099* (2006.01)

(56) References Cited

U.S. PATENT DOCUMENTS

| | | |
|---|---|---|
| 5,416,808 A | 5/1995 | Witsaman et al. |
| 5,491,792 A | 2/1996 | Grisham et al. |
| 5,564,285 A | 10/1996 | Jurewicz et al. |
| 5,592,486 A | 1/1997 | Lo et al. |
| 5,896,524 A | 4/1999 | Halstead, Jr. et al. |
| 6,055,246 A | 4/2000 | Jones |
| 6,084,856 A | 7/2000 | Simmons et al. |
| 6,144,714 A | 11/2000 | Bleiweiss et al. |
| 6,199,169 B1 | 3/2001 | Voth |
| 6,289,023 B1 | 9/2001 | Dowling et al. |
| 6,449,291 B1 | 9/2002 | Burns et al. |
| 6,535,926 B1 | 3/2003 | Esker |
| 6,556,638 B1 | 4/2003 | Blackburn |
| 6,718,476 B1 | 4/2004 | Shima |
| 6,918,049 B2 | 7/2005 | Lamb et al. |
| 7,111,184 B2 | 9/2006 | Thomas, Jr. et al. |
| 7,191,354 B2 | 3/2007 | Purho |
| 7,245,627 B2 | 7/2007 | Goldenberg et al. |
| 7,254,646 B2 | 8/2007 | Aguilera et al. |
| 7,334,124 B2 | 2/2008 | Pham et al. |
| 7,412,475 B1 | 8/2008 | Govindarajalu |
| 7,440,474 B1 | 10/2008 | Goldman et al. |
| 7,447,975 B2 | 11/2008 | Riley |
| 7,483,448 B2 | 1/2009 | Bhandari et al. |
| 7,496,686 B2 | 2/2009 | Coyle |
| 7,535,933 B2 | 5/2009 | Zerbe et al. |
| 7,623,552 B2 | 11/2009 | Jordan et al. |
| 7,636,767 B2 | 12/2009 | Lev-Ran et al. |
| 7,650,158 B2 | 1/2010 | Indirabhai |
| 7,656,751 B2 | 2/2010 | Rischar et al. |
| 7,750,685 B1 | 7/2010 | Bunch et al. |
| 7,904,713 B1 | 3/2011 | Zajkowski et al. |
| 7,941,684 B2 | 5/2011 | Serebrin et al. |
| 8,065,052 B2 | 11/2011 | Fredriksson et al. |
| 8,341,454 B1 | 12/2012 | Kondapalli |
| 8,370,675 B2 | 2/2013 | Kagan |
| 8,407,478 B2 | 3/2013 | Kagan et al. |
| 8,607,086 B2 | 12/2013 | Cullimore |
| 8,699,406 B1 | 4/2014 | Charles et al. |
| 8,879,552 B2 | 11/2014 | Zheng |
| 8,930,647 B1 | 1/2015 | Smith |
| 9,344,265 B2 | 5/2016 | Kames |
| 9,397,960 B2 | 7/2016 | Arad et al. |
| 9,549,234 B1 | 1/2017 | Mascitto |
| 9,979,998 B1 | 5/2018 | Pogue et al. |
| 10,014,937 B1 | 7/2018 | Di Mola et al. |
| 10,027,601 B2 | 7/2018 | Narkis et al. |
| 10,054,977 B2 | 8/2018 | Mikhaylov et al. |
| 10,164,759 B1 | 12/2018 | Volpe |
| 10,320,646 B2 | 6/2019 | Mirsky et al. |
| 10,637,776 B2 | 4/2020 | Iwasaki |
| 10,727,966 B1 | 7/2020 | Izenberg et al. |
| 11,070,304 B1 | 7/2021 | Levi et al. |
| 2001/0006500 A1 | 7/2001 | Nakajima et al. |
| 2002/0027886 A1 | 3/2002 | Fischer et al. |
| 2002/0031199 A1 | 3/2002 | Rolston et al. |
| 2004/0096013 A1 | 5/2004 | Laturell et al. |
| 2004/0153907 A1 | 8/2004 | Gibart |
| 2005/0033947 A1 | 2/2005 | Morris et al. |
| 2005/0268183 A1 | 12/2005 | Barmettler |
| 2006/0109376 A1 | 5/2006 | Chaffee et al. |
| 2007/0008044 A1 | 1/2007 | Shimamoto |
| 2007/0072451 A1 | 3/2007 | Tazawa et al. |
| 2007/0104098 A1 | 5/2007 | Kimura et al. |
| 2007/0124415 A1 | 5/2007 | Lev-Ran et al. |
| 2007/0139085 A1* | 6/2007 | Elliot .................. G06F 5/06 327/100 |
| 2007/0159924 A1 | 7/2007 | Vook et al. |
| 2007/0266119 A1 | 11/2007 | Ohly |
| 2008/0069150 A1 | 3/2008 | Badt et al. |
| 2008/0285597 A1 | 11/2008 | Downey et al. |
| 2009/0257458 A1 | 10/2009 | Cui et al. |
| 2010/0280858 A1 | 11/2010 | Bugenhagen |
| 2011/0182191 A1 | 7/2011 | Jackson |
| 2011/0194425 A1 | 8/2011 | Li et al. |
| 2012/0076319 A1* | 3/2012 | Terwal ................ H04L 7/0008 381/86 |
| 2012/0301134 A1 | 11/2012 | Davari et al. |
| 2013/0045014 A1 | 2/2013 | Mottahedin et al. |
| 2013/0215889 A1 | 8/2013 | Zheng et al. |
| 2013/0235889 A1* | 9/2013 | Aweya ................ H04L 7/0079 370/516 |
| 2013/0294144 A1 | 11/2013 | Wang et al. |
| 2013/0315265 A1 | 11/2013 | Webb, III et al. |
| 2013/0336435 A1* | 12/2013 | Akkihal .............. H04J 3/0673 375/356 |
| 2014/0153680 A1 | 6/2014 | Garg et al. |
| 2014/0185632 A1 | 7/2014 | Steiner et al. |
| 2014/0253387 A1 | 9/2014 | Gunn et al. |
| 2014/0301221 A1 | 10/2014 | Nadeau et al. |
| 2014/0321285 A1 | 10/2014 | Chew et al. |
| 2015/0078405 A1 | 3/2015 | Roberts |
| 2015/0127978 A1 | 5/2015 | Cui et al. |
| 2015/0163050 A1* | 6/2015 | Han ..................... G09G 5/008 375/362 |
| 2015/0318941 A1 | 11/2015 | Zheng et al. |
| 2016/0072602 A1 | 3/2016 | Earl et al. |
| 2016/0110211 A1 | 4/2016 | Kames |
| 2016/0277138 A1 | 9/2016 | Garg et al. |
| 2016/0315756 A1 | 10/2016 | Tenea et al. |
| 2017/0005903 A1 | 1/2017 | Mirsky |
| 2017/0126589 A1 | 5/2017 | Estabrooks et al. |
| 2017/0214516 A1 | 7/2017 | Rivaud et al. |
| 2017/0302392 A1 | 10/2017 | Farra et al. |
| 2017/0331926 A1 | 11/2017 | Raveh et al. |
| 2017/0359137 A1 | 12/2017 | Butterworth et al. |
| 2018/0059167 A1 | 3/2018 | Sharf et al. |
| 2018/0152286 A1 | 5/2018 | Kemparaj et al. |
| 2018/0188698 A1* | 7/2018 | Dionne ................. G04R 20/04 |
| 2018/0191802 A1 | 7/2018 | Yang et al. |
| 2018/0227067 A1 | 8/2018 | Hu et al. |
| 2018/0309654 A1 | 10/2018 | Achkir et al. |
| 2019/0007189 A1 | 1/2019 | Hossain et al. |
| 2019/0014526 A1 | 1/2019 | Bader et al. |
| 2019/0089615 A1 | 3/2019 | Branscomb et al. |
| 2019/0149258 A1 | 5/2019 | Araki et al. |
| 2019/0158909 A1 | 5/2019 | Kulkarni et al. |
| 2019/0273571 A1 | 9/2019 | Bordogna et al. |
| 2019/0319729 A1 | 10/2019 | Leong et al. |
| 2019/0349392 A1 | 11/2019 | Wetterwald et al. |
| 2019/0379714 A1 | 12/2019 | Levi et al. |
| 2020/0162234 A1 | 5/2020 | Almog et al. |
| 2020/0169379 A1 | 5/2020 | Gaist et al. |
| 2020/0304224 A1 | 9/2020 | Neugeboren |
| 2020/0331480 A1 | 10/2020 | Zhang et al. |
| 2020/0344333 A1 | 10/2020 | Hawari et al. |
| 2020/0396050 A1 | 12/2020 | Perras et al. |
| 2020/0401434 A1 | 12/2020 | Thampi et al. |
| 2021/0141413 A1 | 5/2021 | Levi et al. |
| 2021/0218431 A1 | 7/2021 | Narayanan et al. |
| 2021/0243140 A1 | 8/2021 | Levi et al. |
| 2021/0297230 A1 | 9/2021 | Dror et al. |
| 2021/0318978 A1 | 10/2021 | Hsung |
| 2021/0328900 A1 | 10/2021 | Sattinger et al. |
| 2021/0392065 A1 | 12/2021 | Sela et al. |

(56) References Cited

U.S. PATENT DOCUMENTS

| | | | |
|---|---|---|---|
| 2022/0021393 | A1 | 1/2022 | Ravid et al. |
| 2022/0066978 | A1 | 3/2022 | Mishra et al. |

FOREIGN PATENT DOCUMENTS

| | | | |
|---|---|---|---|
| EP | 1215559 | B1 | 9/2007 |
| EP | 2770678 | A1 | 8/2014 |
| JP | 2011091676 | A | 5/2011 |
| WO | 2012007276 | A1 | 1/2012 |
| WO | 2013124782 | A2 | 8/2013 |
| WO | 2013143112 | A1 | 10/2013 |
| WO | 2014029533 | A1 | 2/2014 |
| WO | 2014138936 | A1 | 9/2014 |

OTHER PUBLICATIONS

U.S. Appl. No. 16/779,611 Office Action dated Jun. 24, 2022.
"Precision Time Protocol," PTP Clock Types, CISCO, pp. 1-52, Jul. 30, 2020, as downloaded from https://www.cisco.com/c/en/us/td/docs/dcn/aci/apic/5x/system-management-configuration/cisco-apic-system-management-configuration-guide-52x/m-precision-time-protocol.pdf.
ITU-T Standard G.8264/Y.1364, "Distribution of timing information through packet networks", pp. 1-42, Aug. 2017.
ITU-T Standard G.8261/Y.1361, "Timing and synchronization aspects in packet networks", pp. 1-120, Aug. 2019.
ITU-T Standard G.8262/Y.1362, "Timing characteristics of synchronous equipment slave clock", pp. 1-44, Nov. 2018.
U.S. Appl. No. 17/120,313 Office Action dated Aug. 29, 2022.
IPCLOCK, "IEEE 1588 Primer," ip-clock.com, pp. 1-3, May 1, 2017 (downloaded from https://web.archive.org/web/20170501192647/http://ip-clock.com/IEEE-1588-primer/).
U.S. Appl. No. 16/900,931 Office Action dated Apr. 28, 2022.
U.S. Appl. No. 16/683,309 Office Action dated Mar. 17, 2022.
U.S. Appl. No. 16/779,611 Office Action dated Mar. 17, 2022.
U.S. Appl. No. 17/120,313 Office Action dated Mar. 28, 2022.
U.S. Appl. No. 17/191,736 Office Action dated Apr. 26, 2022.
EP Application # 21214269 Search Report dated May 2, 2022.
U.S. Appl. No. 17/148,605 Office Action dated May 17, 2022.
IEEE Standard 1588™—2008: "IEEE Standard for a Precision Clock Synchronization Protocol for Networked Measurement and Control Systems", IEEE Instrumentation and Measurement Society, Revision of IEEE Standard 1588-2002, USA, pp. 1-289, Jul. 24, 2008.
Weibel et al., "Implementation and Performance of Time Stamping Techniques", 2004 Conference on IEEE 1588, pp. 1-29, Sep. 28, 2004.
Working Draft Project American National Standard T10/1799-D, "Information Technology—SCSI Block Commands—3 (SBC-3)", pp. 1-220, Revision 19, May 29, 2009.
"Infiniband Architecture: Specification vol. 1", pp. 1-1727, Release 1.2.1, Infiniband Trade Association, Nov. 2007.
Mellanox Technologies, "Mellanox ConnectX IB: Dual-Port InfiniBand Adapter Cards with PCI Express 2.0", pp. 1-2, USA, year 2008.
Wikipedia—"Precision Time Protocol", pp. 1-8, Aug. 24, 2019.
IEEE Std 1588-2002, "IEEE Standard for a Precision Clock Synchronization Protocol for Networked Measurement and Control Systems", IEEE Instrumentation and Measurement Society, pp. 1-154, Nov. 8, 2002.
Weibel, H., "High Precision Clock Synchronization according to IEEE 1588 Implementation and Performance Issues", Zurich University of Applied Sciences, pp. 1-9, Jan. 17, 2005.
Lu et al., "A Fast CRC Update Implementation", Computer Engineering Laboratory, Electrical Engineering Department, pp. 113-120, Oct. 8, 2003.
Texas Instruments, "LMK05318 Ultra-Low Jitter Network Synchronizer Clock With Two Frequency Domains," Product Folder, pp. 1-86, Dec. 2018.
Dlugy-Hegwer et al., "Designing and Testing IEEE 1588 Timing Networks", Symmetricom, pp. 1-10, Jan. 2007.
Mellanox Technologies, "How to test 1PPS on Mellanox Adapters", pp. 1-6, Oct. 22, 2019 downloaded from https://community.mellanox.eom/s/article/How-To-Test-1PPS-on-Mellanox-Adapters.
ITU-T recommendation, "G.8273.2/Y. 1368.2—Timing characteristics of telecom boundary clocks and telecom time slave clocks", pp. 1-50, Jan. 2017.
Wasko et al., U.S. Appl. No. 17/549,949, filed Dec. 14, 2021.
Levi et al., U.S. Appl. No. 17/120,313, filed Dec. 14, 2020.
Mula et al., U.S. Appl. No. 17/148,605, filed Jan. 14, 2021.
Levy et al., U.S. Appl. No. 17/313,026, filed May 6, 2021.
Manevich et al., U.S. Appl. No. 17/579,630, filed Jan. 20, 2022.
U.S. Appl. No. 17/579,630 Office Action dated Oct. 24, 2022.
U.S. Appl. No. 17/579,630 Office Action dated Jan. 12, 2023.
U.S. Appl. No. 17/191,736 Office Action dated Nov. 10, 2022.
U.S. Appl. No. 17/191,736 Advisory Action dated Feb. 16, 2023.

* cited by examiner

SYNTHESIZED CLOCK SYNCHRONIZATION BETWEEN NETWORK DEVICES

RELATED APPLICATION INFORMATION

The present application is a Continuation of U.S. patent application Ser. No. 16/920,772 filed 6 Jul. 2020, which claims benefit of U.S. Provisional Patent Application Ser. No. 62/994,900, filed 26 Mar. 2020 and is a Continuation-In-Part of U.S. patent application Ser. No. 16/199,312 filed 26 Nov. 2018 (now U.S. Pat. No. 10,778,406), the disclosures of which are hereby incorporated herein by reference.

FIELD OF THE INVENTION

The present invention relates to clock synchronization, and in particular relates to clock synchronization in network devices.

BACKGROUND

Clock synchronization among network devices is used in many network applications. One application of using a synchronized clock value is for measuring latency between two devices. If the clocks are not synchronized the resulting latency measurement will be inaccurate.

Synchronous Ethernet (SyncE) is an International Telecommunication Union Telecommunication (ITU-T) Standardization Sector standard for computer networking that facilitates the transference of clock signals over the Ethernet physical layer. In particular, SyncE enables clock synchronization inside a network with respect to a master device clock source or master clock. Each network element (e.g., a switch, a network interface card (NIC), or router) needs to recover the master clock from high-speed data received from the master device clock source and use the recovered master clock for its own data transmission in a manner such that the master clock spreads throughout the network.

SUMMARY

There is provided in accordance with an embodiment of the present disclosure, a network device including frequency generation circuitry configured to generate a clock signal, a phase-locked loop (PLL) configured to generate a local clock based on the clock signal, a plurality of receivers configured to receive respective data streams from respective remote clock sources, each receiver of the plurality of receivers being configured to recover a remote clock from a respective data stream, and a controller configured to identify the remote clock recovered by one of the plurality of receivers as a master clock, find a clock differential between the identified remote clock and the local clock, and provide a control signal to the frequency generation circuitry responsively to the clock differential, which causes the frequency generation circuitry to adjust the clock signal so as to iteratively reduce an absolute value of the clock differential.

Further in accordance with an embodiment of the present disclosure the frequency generation circuitry includes an oscillator, clock switching circuitry, and a frequency mixer configured to combine the control signal from the controller with an output of the switching circuitry to generate the clock signal as a combined signal for output towards the PLL, wherein the clock switching circuitry is configured to switch between connecting an output of the oscillator to the PLL, and connecting an output of the frequency mixer to the PLL yielding a closed feedback loop with the frequency mixer.

Still further in accordance with an embodiment of the present disclosure, the device includes a clock clean-up PLL disposed between the Output of the frequency mixer and an input of the switching circuitry to remove jitter from the combined signal.

Additionally, in accordance with an embodiment of the present disclosure, the device includes a shaper disposed between the controller and the frequency mixer to delay receipt, by the frequency mixer, of the control signal provided by the controller.

Moreover, in accordance with an embodiment of the present disclosure the frequency generation circuitry includes a frequency synthesizer configured to generate the dock signal, and adjust the clock signal responsively to the control signal.

Further in accordance with an embodiment of the present disclosure the frequency generation circuitry includes a voltage controller configured to generate a voltage responsively to the control signal, and the frequency synthesizer includes a voltage-controlled oscillator, which is configured to adjust the clock signal responsively to the generated voltage.

Still further in accordance with an embodiment of the present disclosure the frequency generation circuitry includes an oscillator, the controller is configured to provide the control signal as a digital control signal responsively to the clock differential, and the frequency synthesizer is configured to generate the clock signal responsively to an output of the oscillator and the digital control signal.

Additionally in accordance with an embodiment of the present disclosure, the device includes a first integrated circuit (IC) chip and a second IC chip, the first IC chip and the second IC chip being different IC chips, the first IC chip including a first group of the receivers, the second IC chip including a second group of the receivers.

There is also provided in accordance with another embodiment of the present disclosure, a clock synchronization method including generating a clock signal, generating a local clock based on the clock signal, receiving a plurality of data streams from respective remote clock sources, recovering a remote clock from each of the plurality of data streams, and identifying the remote clock recovered from one of the plurality of data streams as a master clock, finding a clock differential between the identified remote clock and the local clock, and providing a control signal responsively to the clock differential, the clock signal causing adjustment of the clock signal so as to iteratively reduce an absolute value of the clock differential.

Moreover in accordance with an embodiment of the present disclosure, the method includes combining the control signal with an output of switching circuitry in a frequency mixer to generate the clock signal as a combined signal, and switching by the switching circuitry between connecting an output of an oscillator to a phase-locked loop (PLL), and connecting an output of the frequency mixer to the PLL yielding a closed feedback loop with the frequency mixer.

Further in accordance with an embodiment of the present disclosure, the method includes removing jitter from the combined signal.

Still further in accordance with an embodiment of the present disclosure, the method includes delaying receipt of the control signal.

Additionally, in accordance with an embodiment of the present disclosure, the method includes providing a frequency synthesizer, generating the clock signal by the frequency synthesizer, and adjusting the clock signal responsively to the control signal.

Moreover, in accordance with an embodiment of the present disclosure, the method includes generating a voltage responsively to the control signal, and adjusting the clock signal responsively to the generated voltage.

Further in accordance with an embodiment of the present disclosure, the method includes providing the control signal as a digital control signal responsively to the clock differential, and generating the clock signal responsively to an output of an oscillator and the digital control signal.

There is also provided in accordance with still another embodiment of the present disclosure, a network device including frequency generation circuitry configured to generate a clock signal and includes an oscillator, a frequency mixer, and clock switching circuitry, a phase-locked loop (PLL) configured to generate a local clock based on the clock signal, wherein the clock switching circuitry is configured to switch between connecting an output of the oscillator to the PLL, and connecting an output of the frequency mixer to the PLL yielding a closed feedback loop with the frequency mixer, a plurality of receivers configured to receive respective data streams from respective remote clock sources, each receiver of the plurality of receivers being configured to recover a remote clock from a respective data stream, and a controller configured to identify the remote clock recovered by one of the plurality of receivers as a master clock, find a clock differential between the identified remote clock and the local clock, and provide a control signal to the frequency mixer responsively to the clock differential, which causes the frequency mixer to adjust the dock signal so as to iteratively reduce an absolute value of the clock differential, wherein the frequency mixer is configured to combine the control signal with an output of the switching circuitry to generate the clock signal as a combined signal for output towards the PLL.

Still further in accordance with an embodiment of the present disclosure, the device includes a clock clean-up PLL disposed between the output of the frequency mixer and an input of the switching circuitry to remove jitter from the combined signal.

Additionally, in accordance with an embodiment of the present disclosure, the device includes a shaper disposed between the controller and the frequency mixer to delay receipt, by the frequency mixer, of the control signal provided by the controller.

Moreover in accordance with an embodiment of the present disclosure, the device includes a first integrated circuit (IC) chip and a second IC chip, the first IC chip and the second IC chip being different IC chips, the first IC chip including a first group of the receivers, the second IC chip including a second group of the receivers.

There is also provided in accordance with still another embodiment of the present disclosure a network device including frequency generation circuitry including a frequency synthesizer configured to generate a clock signal, a phase-locked loop (PLL) configured to generate a local clock based on the clock signal, a plurality of receivers configured to receive respective data streams from respective remote clock sources, each receiver of the plurality of receivers being configured to recover a remote clock from a respective data stream, and a controller configured to identify the remote clock recovered by one of the plurality of receivers as a master clock, find a clock differential between the identified remote clock and the local clock, and provide a control signal to the frequency generation circuitry responsively to the clock differential, which causes the frequency synthesizer to adjust the clock signal so as to iteratively reduce an absolute value of the clock differential.

Further in accordance with an embodiment of the present disclosure the frequency generation circuitry includes a voltage controller configured to generate a voltage responsively to the control signal, and the frequency synthesizer includes a voltage-controlled oscillator, which is configured to adjust the clock signal responsively to the generated voltage.

Still further in accordance with an embodiment of the present disclosure the frequency generation circuitry includes an oscillator, the controller is configured to provide the control signal as a digital control signal, and the frequency synthesizer is configured to generate the clock signal responsively to an output of the oscillator and the digital control signal.

Additionally in accordance with an embodiment of the present disclosure, the device includes a first integrated circuit (IC) chip and a second IC chip, the first IC chip and the second IC chip being different IC chips, the first IC chip including a first group of the receivers, the second IC chip including a second group of the receivers.

BRIEF DESCRIPTION OF THE DRAWINGS

The present invention will be understood from the following detailed description, taken in conjunction with the drawings in which.

DESCRIPTION OF EXAMPLE EMBODIMENTS

Overview

Figure 1:
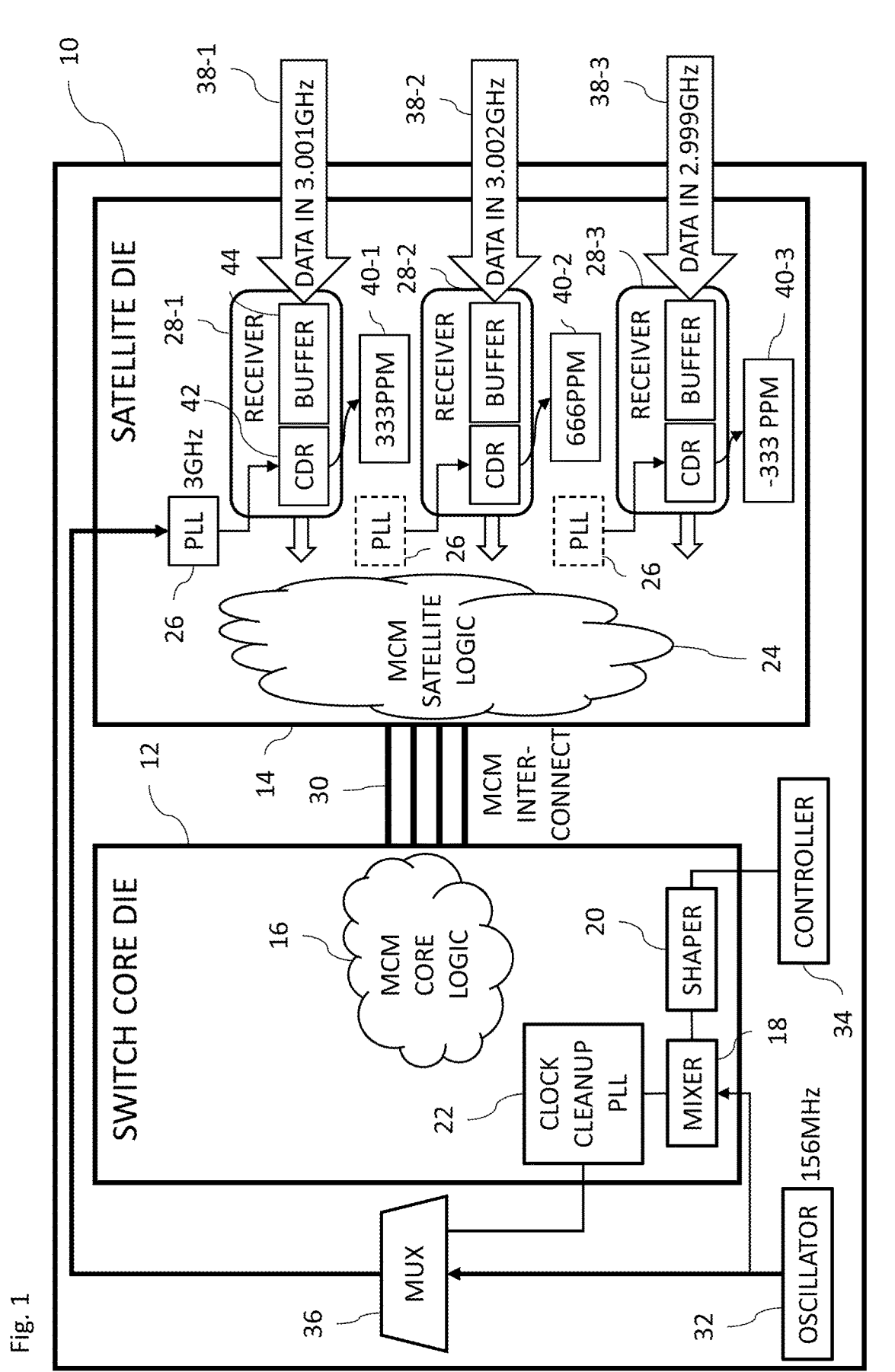
FIG. 1 is a schematic block diagram view of a network device constructed and operative in accordance with an embodiment of the present invention.

A source of a master clock is generally designated by a network management function. As such there may be situations in which the identity of the source of the master dock is currently not known, for example, when a network device is booted or a connection to the source of the master clock is lost.

In devices with many ports or lanes, such as high bandwidth switches or routers, the clock used by each port or lane needs to be synchronized with the master clock. As the identity of the source of the master clock may not currently be known, the common practice is to use the recovered clock extracted from a clock recovery circuit within each Serializer/Deserializer (SerDes) receiver of the network device to recover the clocks from the various streams received by ports of the network device. The recovered clocks from the various streams received by the ports are multiplexed throughout the network device to all the ports and lanes of the network device so that once the source of the master clock is designated, the relevant recovered clock value may be used by the ports and lanes of the network device. The recovered clocks may be divided and multiplexed in groups depending on the configuration of the network device.

The above synchronization method becomes increasingly complex as the integrated circuits of the network devices become bigger. Buffering the recovered clocks throughout the integrated circuit adds noise to the sensitive circuits and data could be lost. Moreover, in network devices with more than one die, die-to-die clock routing may add unnecessary jitter which could harm the clock quality and require a significant routing effort in the device.

In embodiments of the present invention, clock synchronization is achieved without the need to multiplex the recovered clocks of each receiver over the integrated circuit(s) of the network device, thereby simplifying clock synchronization without adding unnecessary noise and jitter in the network device. Additionally, embodiments of the present invention scale for network devices with multiple dies and/or multi-chip modules and any suitable number of ports and lanes.

In embodiments described below, the network device includes frequency generation circuitry which generates a clock signal. The frequency generation circuitry may include an oscillator such as a crystal oscillator to generate the clock signal. An on-chip phase-locked loop (PLL) generates a local high-speed clock based on the clock signal. The local clock may be used by all ports and lanes in the network device as a reference clock until a master clock is designated by a network management function.

The receivers in the network device receive respective data streams from respective remote clock sources. A clock and data recovery (CDR) process running in each receiver recovers a remote clock from the respective data stream of the respective remote clock source. The CDR may also compute a clock differential between the recovered remote clock and the local clock of the network device.

Once the master clock has been designated, a controller identifies the remote clock recovered by one of the receiver "selected receiver") as the master clock. The controller typically comprises a programmable processor, which performs the functions described herein under the control of firmware or other software. Additionally, or alternatively, at least some of these functions can be carried out by hardware logic, which may be hard-wired or programmable. The controller also finds the clock differential between the identified remote clock and the local clock, for example, by reading the clock differential from a register written to by the selected receiver that computed the clock differential. In some embodiments, instead of the receivers computing the clock differentials, the controller may compute the clock differential of the selected receiver based on the local high-speed clock of the PLL and the recovered remote clock recovered by the selected receiver.

The clock differential of the selected receiver provides an indication of whether the local clock is faster or slower than the master clock and by how much. The difference between the local clock and the master clock may be expressed in any suitable measurement unit, for example, Hz or parts-per-million (PPM).

The controller provides a control signal to the frequency generation circuitry to slow down or speed up the clock signal depending on whether the local clock is faster or slower than the master clock. The control signal may also be a function of the magnitude of the clock differential. The resulting change in the clock signal generated by the frequency generation circuitry causes a change in the local clock generated by the PLL. The change in the local clock generated by the PLL in turn causes a change in the clock differential between the local clock generated by the PLL and the recovered remote clock recovered by the selected receiver.

The controller adjusts the control signal so as to slow down or speed up the clock signal according to the new clock differential, which provides an indication of whether the local clock is still faster or slower than the master clock and by how much.

The above process is repeated so as to iteratively reduce an absolute value of the clock differential, for example until the absolute value of the clock differential is less than a given value. In the above way, the local clock generated by the PLL is synchronized with the master clock.

In some embodiments, the frequency generation circuitry includes an oscillator, clock switching circuitry and a frequency mixer. The clock switching circuitry selectively connects inputs from the frequency mixer and the oscillator to the PLL and an input of the frequency mixer. The clock switching circuitry connects the output of the oscillator to the PLL when the mixer does not provide a stable output thereby providing the output of the oscillator as the clock signal. When the mixer provides a stable output, the clock switching circuitry connects the output of the mixer to the PLL thereby creating a closed feedback loop in which the mixer combines the output of the clock switching circuitry (which previously included the output of the oscillator) with the control signal so as to adjust the clock signal.

In other embodiments, the frequency generation circuitry may include a digital voltage-controlled oscillator (VCO), which is controlled by a voltage controller, which is in turn controlled by the control signal generated by the controller. The voltage output of the voltage controller is controlled by control signal from the controller. The VCO provides the clock signal according to the voltage provided by the voltage controller. The control signal is used to adjust the output of the voltage controller, which in turn adjusts the output (e.g., the clock signal) of the VCO until the local clock is synchronized with the master clock.

In some embodiments, the frequency generation circuitry may include a frequency synthesizer (e.g., a low or ultra-low network jitter synchronizer) which has two inputs, one from an oscillator, and one from the controller. The frequency synthesizer generates the clock signal based on the output of the oscillator as adjusted by the control signal from the controller.

System Description

Documents incorporated by reference herein are to be considered an integral part of the application except that, to the extent that any terms are defined in these incorporated documents in a manner that conflicts with definitions made explicitly or implicitly in the present specification, only the definitions in the present specification should be considered.

Reference is now made to FIG. 1, which is a schematic block diagram view of a network device 10 constructed and operative in accordance with an embodiment of the present invention. The network device 10 includes a switch core die 12 and a satellite die 14.

The switch core die 12 includes multi-chip module (MCM) core logic 16 and switching circuitry to perform switching functions. The switch core die 12 also includes a frequency mixer 18, a shaper 20 and a clock cleanup PLL 22. In some embodiments the frequency mixer 18, the shaper 20 and/or the clock cleanup PIA, 22 may be implemented off of the main dies of the network device 10. The frequency mixer 18, the shaper 20 and the clock cleanup PLL 22 are described in more detail with reference to FIGS. 2-4.

The satellite die 14 includes MCM satellite logic 24 to perform receiving and transmission functions of the switch. The satellite die 14 may also include a PLL 26 and a plurality of receivers 28 and connections to a plurality of ports (not shown). The receivers 28 have been labelled individually as 28-1, 28-2 and 28-3 for the sake of simplified reference. The switch core die 12 and the satellite die 14 are generally connected using an MCM interconnect 30.

The network device 10 may also include an oscillator 32, a controller 34, and a multiplexer 36. The controller 34 is described in more detail with reference to FIGS. 2-5. The oscillator 32 and the frequency mixer 18 form part of frequency generation circuitry of the network device 10.

Although the network device 10 has been described with reference to a multi-die network switch, embodiments of the present invention may be implemented on any suitable network switch including one or more dies or any suitable network device, for example, but not limited to a network router with one or more dies.

The oscillator 32 is configured to generate a clock signal. The oscillator 32 may be a crystal oscillator or any other suitable oscillator. The frequency of the clock signal may be any suitable frequency. In the example, of FIG. 1 the frequency of the clock signal generated by the oscillator is 156 MHz. The multiplexer 36 is disposed between the oscillator 32 and the PLL 26. The multiplexer 36 is configured as a switch under control of the controller 34. Any suitable switching circuitry may be used instead of the multiplexer 36. The multiplexer 36 enables switching between using the output of the oscillator 32 as the clock signal and an output of the frequency mixer 18 as the clock signal as will become clearer with reference to FIG. 2. On booting of the network device 10 or until a master clock is designated by a network management function, the PLL 26 receives the clock signal from the oscillator 32 via the multiplexer 36. The PLL 26 is configured to generate a local clock based on the received clock signal. The local clock generated by the PLL 26 may be in the GHz range. In the example of FIG. 1, the PLL 26 has generated a local clock with a frequency of 3 GHz. The local clock is generally used by all the ports and lanes of the network device 10.

The receivers 28 are configured to receive and buffer (in a buffer 44) respective data streams 38 (labeled 38-1 to 38-3) from respective remote clock sources (not shown). For the sake of simplicity only one of the buffers 44 has been labeled with the reference numeral 44. Each receiver 28 may be implemented using any suitable hardware such as a Serializer/Deserializer (SerDes), for example, but not limited to, an LR SerDes RX. The data in the data streams 38 generally arrives from the remote clock sources without a clock value. Each receiver 28 may include a clock and data recovery (CDR) process 42 running therein to recover a remote clock from its received data stream 38, for example based on transitions in the data of the received data stream 38. For the sake of simplicity only one of clock and data recovery (CDR) process 42 has been labeled with the reference numeral 42. The CDR of each receiver 28 may also compute a clock differential 40 (labeled 40-1 to 40-3), which is a difference between its recovered remote clock and the local clock (generated by the PLL 26) (i.e., the recovered remote clock less the local clock) of the network device 10 so that for each received data stream 38, a difference between the recovered remote clock of the data stream 38 and the local clock is computed.

The clock differential 40 is stored in a register of the network device 10. In some embodiments, each clock differential 40 is stored in a register of the receiver 28 that computed that clock differential 40. The clock recovery may be implemented based on any suitable process, including a non-CDR based process, for example, but not limited to, using a delay-locked loop and oversampling of the data stream. The data streams 38, apart from their use in recovery of the remote clocks, generally include data for forwarding to other devices in the network. Therefore, the data streams 38 are generally forwarded via the MCM interconnect 30 to the multi-chip module core logic 16 to perform various switching functions (or routing functions when the network device 10 is implemented as a router). The recovered clocks and the clock differentials 40 are generally not forwarded to the multi-chip module core logic 16 via the MCM interconnect 30.

FIG. 1 shows that data stream 38-1 received by the receiver 28-1 has a recovered clock of 3.001 GHz. Therefore, the clock differential 40-1 between the recovered clock of the received data stream 38-1 of 3.001 GHz and the local clock of 3 GHz is +333 PPM (i.e., the master clock is faster than the local clock by 333 PPM). The data stream 38-2 received by the receiver 28-2 has a recovered clock of 3.002 GHz. Therefore, the clock differential 40-2 between the recovered clock of the received data stream 38-2 of 3.002 GHz and the local clock of 3 GHz is +666 PPM (i.e., the master clock is faster than the local clock by 666 PPM). The data stream 38-3 received by the receiver 28-3 has a recovered clock of 2.999 GHz. Therefore, the clock differential 40-3 between the recovered clock of the received data stream 38-3 of 2.999 GHz and the local clock of 3 GHz is −333 PPM (i.e., the master clock is slower than the local clock by 333 PPM).

The example of FIG. 1 shows three receivers 28. The number of receivers 28 may be any suitable number of receivers and is not limited to three. The example of FIG. 1 shows three boxes for the PLL 26, one with a solid-line box and two with a dotted-line box. The three boxes represent the same PLL 26, which has been duplicated twice for the sake of clarity.

Figure 2:
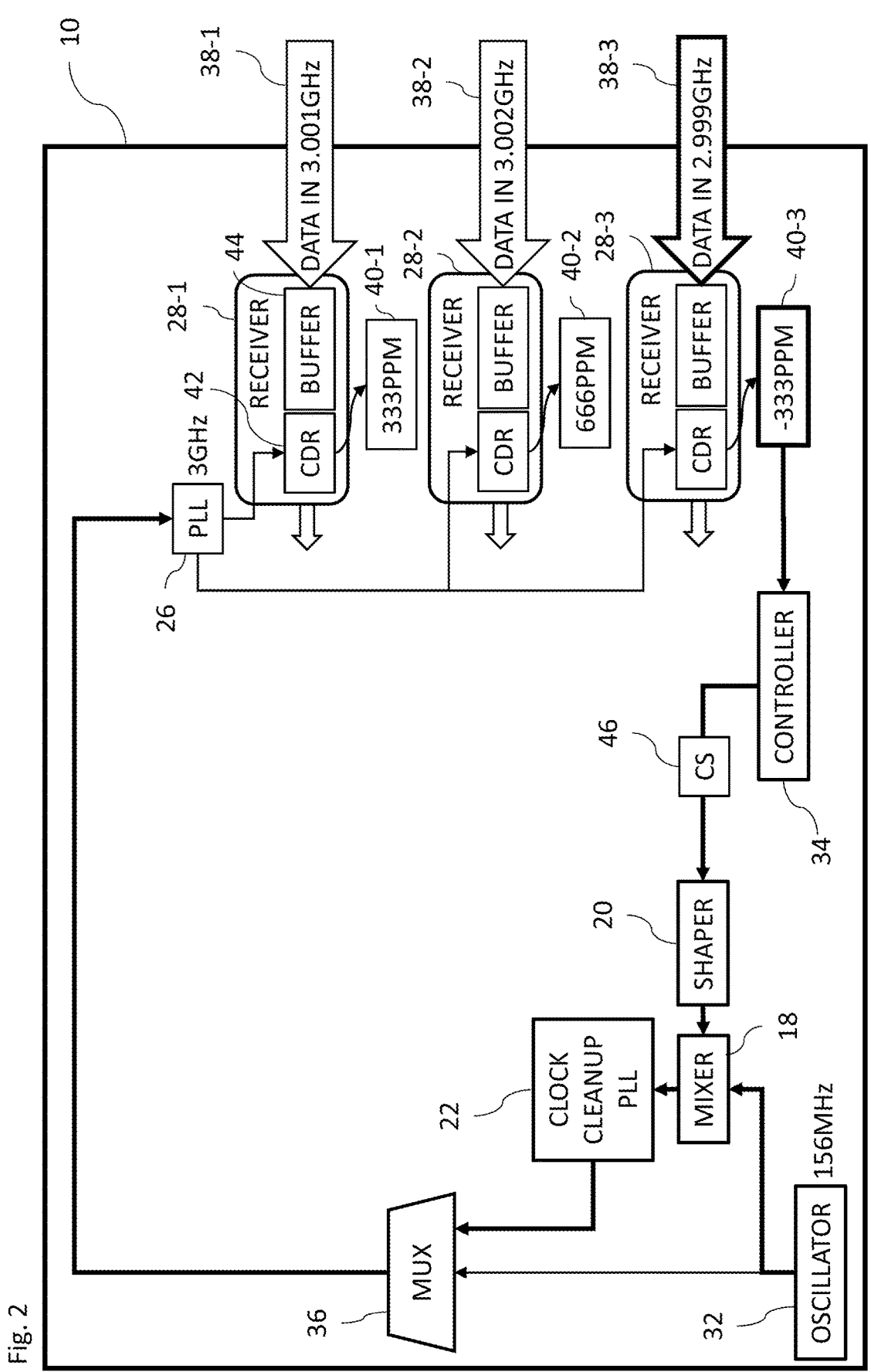
FIG. 2 is a schematic block diagram view of the network device of FIG. 1 in an initial stage of clock synchronization.

Reference is now made to FIG. 2, which is a schematic block diagram view of the network device 10 of FIG. 1 in an initial stage of clock synchronization. Some of the elements of the network device 10 shown in FIG. 1 have not been included in FIGS. 2-4 for the sake of simplicity. At this stage, the master clock has been designated by the network management function. The designation of the master clock may be received by the controller 34. In some embodiments, the network management function may run on the controller 34 so that the controller 34 effectively designates the master clock. In the example of FIG. 2, the remote clock source generating the master clock is also sending the data stream 38-3 which is received by the receiver 28-3. The frequency of the master clock is therefore equal to 2.999 GHz which is 333 PPM slower than the local clock of 3 GHz generated by the PLL 26. The adjustment of the local clock to the master clock associated with the data stream 38-3 is now described in more detail.

The controller 34 is configured to identify the remote clock recovered by one of the receivers 28 (i.e., recovered from one of the data streams 38) as a master clock. As mentioned above, in the example of FIG. 2 the identified remote clock was recovered by the receiver 28-3 from the data stream 38-3.

The controller 34 is configured to find the clock differential 40-3 −333 PPM) between the identified remote clock and the local clock generated by the PLL 26. The controller 34 may "find" the clock differential 40-3 by reading the clock differential 40-3 from a register, e.g., a register of the receiver 28-3 or by computing the clock differential 40-3 from the local clock generated by the PPL 26 and the remote clock recovered by the receiver 28-3.

The controller 34 is configured to generate a control signal 46, responsively to the clock differential 40-3, for providing to the frequency mixer 18 to slow down or speed up the clock signal provided to the PLL 26. In the example of FIG. 2 the local clock is faster than the master clock, therefore the control signal 46 needs to slow down the clock signal provided to the PLL 26. The controller 34 is generally configured to change the clock signal provided to the PLL 26 slowly, for example, but not limited to, by the smallest resolution possible. For example, a slow-down command may be given until the feedback indicates that the clock needs to run quicker. Then a "metastable" state is entered where the clock speed is adjusted up and down in succession, thereby indicating that the target frequency has been reached.

In some embodiments, the frequency mixer 18 may aggregate the control signal 46 adjustments. In other embodiments, the frequency mixer 18 may use the current control signal 46 without aggregating previous control signals 46. In such a case, the control signal 46 is provided by the controller 34 continuously or frequently enough to maintain the required adjusted output of the frequency mixer 18.

The controller 34 is configured to provide the control signal 46 to the frequency mixer 18 via the shaper 20. The shaper 20 delays receipt of the control signal 46 by the frequency mixer 18. The shaper 20 is described in more detail with reference to FIG. 3. In some embodiments the shaper 20 is not included in the network device 10 and delay may optionally be provided by another element.

The frequency mixer 18 is configured to combine the control signal 46 from the controller 34 with an output from the oscillator 32 (the 156 MHz clock signal in the example of FIG. 2) yielding a clock signal (which in the example of FIG. 2 should be less than 156 MHz), as a combined signal, for output towards the PLL 26 via the clock cleanup PLL 22. The clock cleanup PLL 22 is disposed between an output of the frequency mixer 18 and an input of the PLL 26 to remove jitter from the combined signal. In some embodiments, the clock cleanup PLL 22 is not included in the network device 10.

In some embodiments, the frequency mixer 18 may be implemented with a higher speed mixer and a frequency divider to improve resolution of the mixer ticks. A mixer tick is a single mixer step in any direction. The above is now illustrated by way of an example of a frequency mixer operating at 1.56 GHz so that corrections to the output of the frequency mixer are made in a 1.56 GHz resolution so that the corrections may be more accurate. The output of the higher speed mixer is then scaled down using a frequency divider which in this example would divide the output of the mixer by 10.

Although at this point the output of the oscillator 32 is connected to an input of the frequency mixer 18, the direct output from the oscillator 32 via the multiplexer 36 is blocked under control of the controller 34. The multiplexer 36 is now configured to route the output of the frequency mixer 18 and the clock cleanup PLL 22 to the PLL 26. Therefore, at around the same time that the control signal 46 is sent to the frequency mixer 18 via the shaper 20, the controller 34 is also configured to provide another control signal to the multiplexer 36 to switch to connecting the output of the frequency mixer 18 via the clock cleanup PLL 22 to the PLL 26. The switching is generally performed when the absolute value of the clock differential 40-3 is greater than a given value. If the absolute value of the clock differential 40-3 is less than the given value then there is generally no need to synchronize the local clock with the master clock as the value of the local clock and the master clock are the same or are close enough. Therefore, the multiplexer 36 is configured under control of the controller 34 to switch between: connecting the output of the oscillator 32 to the PLL 26; and connecting the output of the frequency mixer 18 to the PIA, 26 (i.e. switching between using the output of the oscillator 32 as the clock signal and using the combined signal as the clock signal).

In some embodiments, the multiplexer 36 may include suitable logic to switch back to routing the output of the oscillator 32 to the PLL 26 if the frequency mixer 18 no longer provides a signal or provides a signal that includes too much jitter or too much frequency drift. This could occur if the link to the master clock is down. The amount of jitter and frequency drift that could cause the switch-back is generally implementation dependent.

Figure 3:
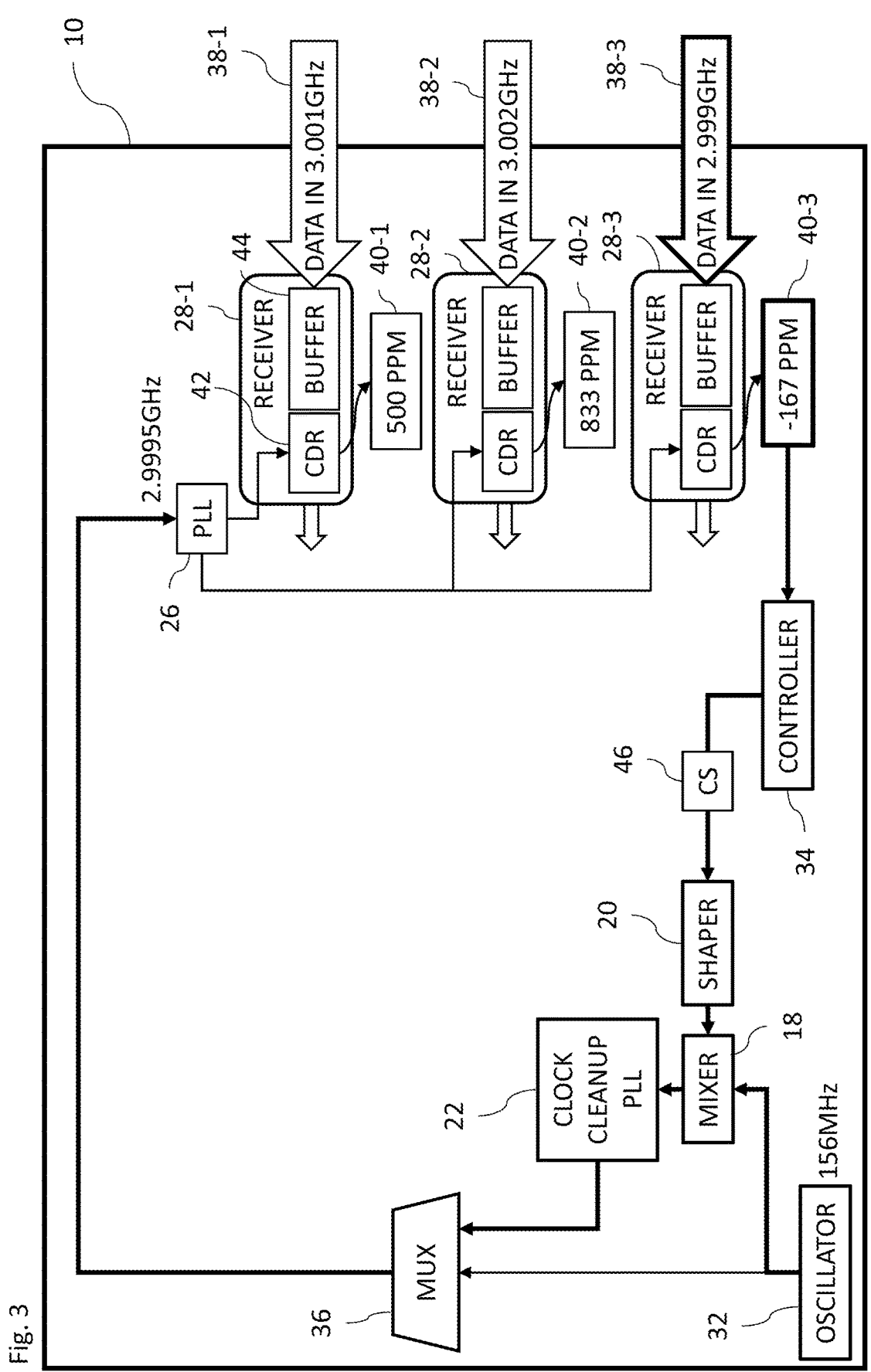
FIG. 3 is a schematic block diagram view of the network device of in a later stage of clock synchronization.

Reference is now made to FIG. 3, which is a schematic block diagram view of the network device 10 of FIG. 1 in a later stage of clock synchronization. The adjusted clock signal outputted by the frequency mixer 18 via the clock cleanup PLL 22 and the multiplexer 36 is received by the PLL 26. The PLL 26 therefore now generates the local clock based on the adjusted clock signal generated by the frequency mixer 18 and cleaned by the clock cleanup PLL 22. FIG. 3 shows that the control signal 46 has caused a reduction in the local clock generated by the PPL 26 from 3 GHz to 2.9995 GHz. In response to the adjustment of the local clock to 2.9995 GHz, the clock differential 40-3 computed by the clock and data recovery (CDR) process 42 of the receiver 28-3 or by the controller 34 is updated. The updated clock differential 40-3 in the example of FIG. 3 is equal to the difference between the master clock value of 2.999 GHz and the local clock value of 3 GHz, giving −167 PPM. In other words, the master clock is slower than the local clock by 167 PPM.

Therefore, the controller 34 is configured to update the control signal 46, responsively to the updated clock differential 10-3, for providing to the frequency mixer 18 to further slow-down (in the example of FIG. 3) the clock signal provided to the PLL 26. The controller 34 is configured to provide the updated control signal 46 to the frequency mixer 18 via the shaper 20. The frequency mixer 18 is configured to combine the updated control signal 46 from the controller 34 with the output (156 MHz in the example of FIG. 3) from the oscillator 32 yielding an adjusted clock signal, as a combined signal, for output towards the PLL 26 via the clock cleanup PLL 22.

If the control signal 46 performed an over adjustment of the local clock, for example, the local clock is less than the master clock, the controller 34 adjusts the control signal 46 so as to speed up the local clock.

The above process of adjusting the control signal 46 responsively to the clock differential 40-3 causing the frequency mixer 18 to adjust the clock signal is performed iteratively to reduce an absolute value of the clock differential 40-3 to below a given value.

The shaper 20, disposed between the controller 34 and the frequency mixer 18 is configured to delay receipt, by the frequency mixer 18, of the control signal 46 provided by the controller 34. The delaying performed by the frequency mixer 18 attempts to prevent over correction of the clock signal and the local clock by the controller 34 as adjustments to the control signal 46 may take some time to appear in the adjusted clock signal and the adjusted local clock. The delay is generally dependent upon timing of the feedback loop such as time constants of the multiplexer 36, and stabilization time of the frequency mixer 18 to move to a new frequency.

Figure 4:
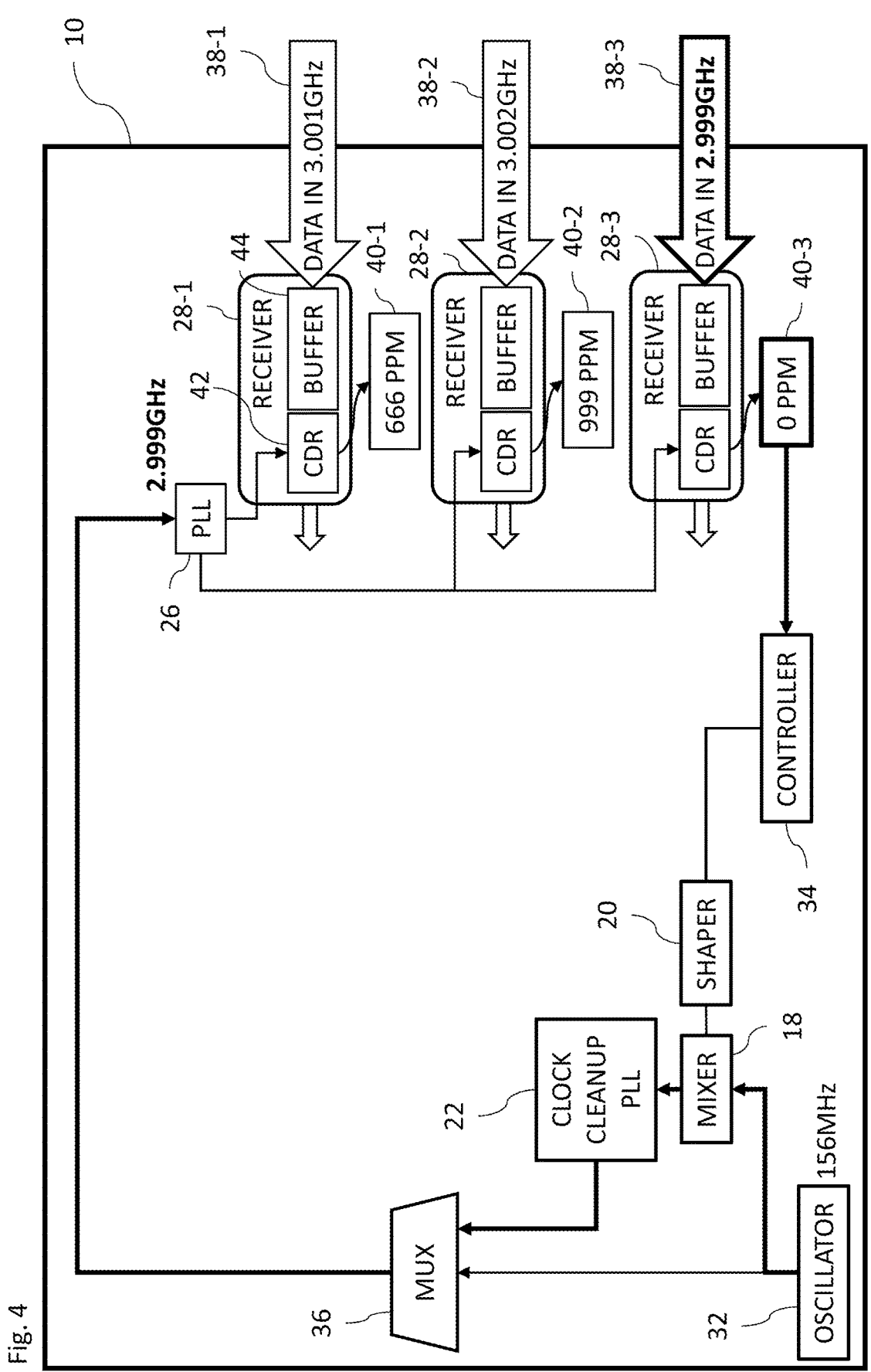
FIG. 4 is a schematic block diagram view of the network device of in a final stage of clock synchronization.

Reference is now made to FIG. 4, which is a schematic block diagram view of the network device 10 of FIG. 1 in a final stage of clock synchronization. The iterative adjustments of the control signal 46 (FIG. 3) have led to the iterative adjustments to the clock signal generated by the frequency mixer 18 and the iterative adjustments to the local clock generated by the PLL 26 so that the local clock is now equal 2.999 GHz which also equals the value of the master clock so that the clock differential 40-3 is now equal to zero. As mentioned above the PPM may need to be reduced to below a given value in order for the local clock to be considered synchronized with the master clock even if the PPM is non-zero.

Figure 5:
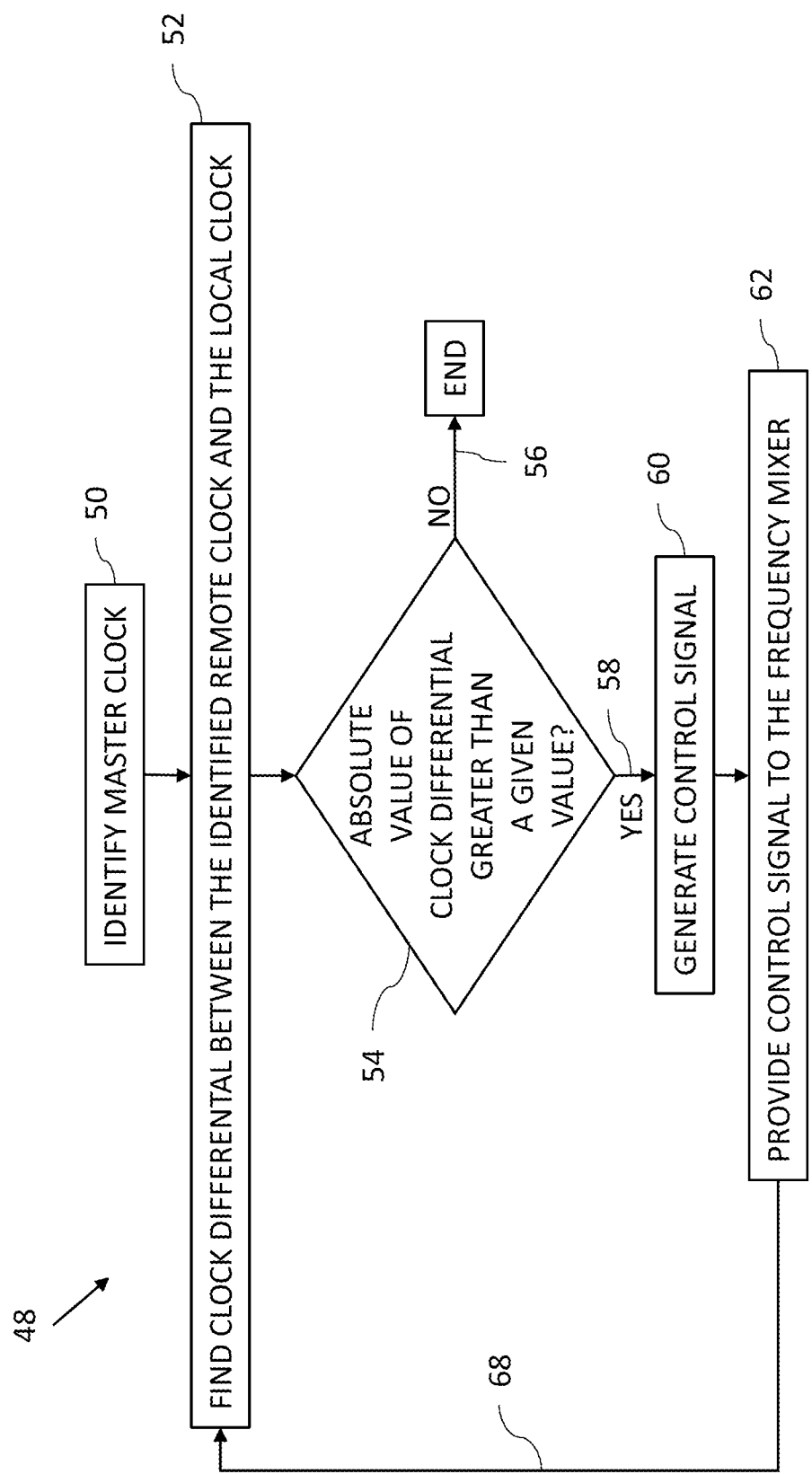
FIG. 5 is a flow chart including exemplary steps in a method of clock synchronization in the network device of FIG. 1.

Reference is now made to FIG. 5, which is a flow chart 48 including exemplary steps in a method of clock synchronization in the network device 10 of FIG. 1. Reference is also made to FIG. 2. The controller 34 is configured to identify (block 50) the remote clock recovered by one of the receivers 28 as the master clock. The controller 34 is configured to find (block 52) the clock differential 40 between the identified remote clock and the local clock.

The controller 34 is configured to check (at a decision block 54) if the absolute value of the clock differential is greater than a given value. If the absolute value of the clock differential is not greater than the given value (branch 56), then there is at present no need to synchronize the local clock with the master clock as the local clock is close enough to the master clock without performing any adjustments. If the absolute value of the clock differential is greater than, or equal to, the given value (branch 58), then the controller 34 is configured to generate (block 60) the control signal 46 described in more detail above with reference to FIGS. 2 and 3.

The controller 34 is configured to provide (block 62) the control signal 46 to the frequency mixer 18 (or any suitable frequency generation circuitry) responsively to the clock differential 40, which causes the frequency mixer 18 (or the frequency generation circuit) to adjust the clock signal so as to iteratively reduce an absolute value of the clock differential.

The controller 34 is configured to provide a control signal to the multiplexer 36 (or any suitable switching circuitry) to switch to connecting the output of the frequency mixer 18 to the PLL 26 (via the clock cleanup PLL 22) when the absolute value of the clock differential is greater than the given value. This step may be performed at any suitable time after the step of block 54 is performed. The multiplexer 36 is generally configured to continue to connect the output of the frequency mixer 18 to the PLL 26 (via the clock cleanup PLL 22) for as long as the connection to the master clock is maintained.

If a new master clock is designated, the controller 34 repeats the steps described above with respect to the receiver 28 of the newly assigned master clock.

The steps of blocks 52-62 are repeated periodically (arrow 68), subject to a delay added by the shaper 20, to perform the iterative adjustment of the clock signal and local clock described above with reference to FIGS. 2-4.

Figure 6:
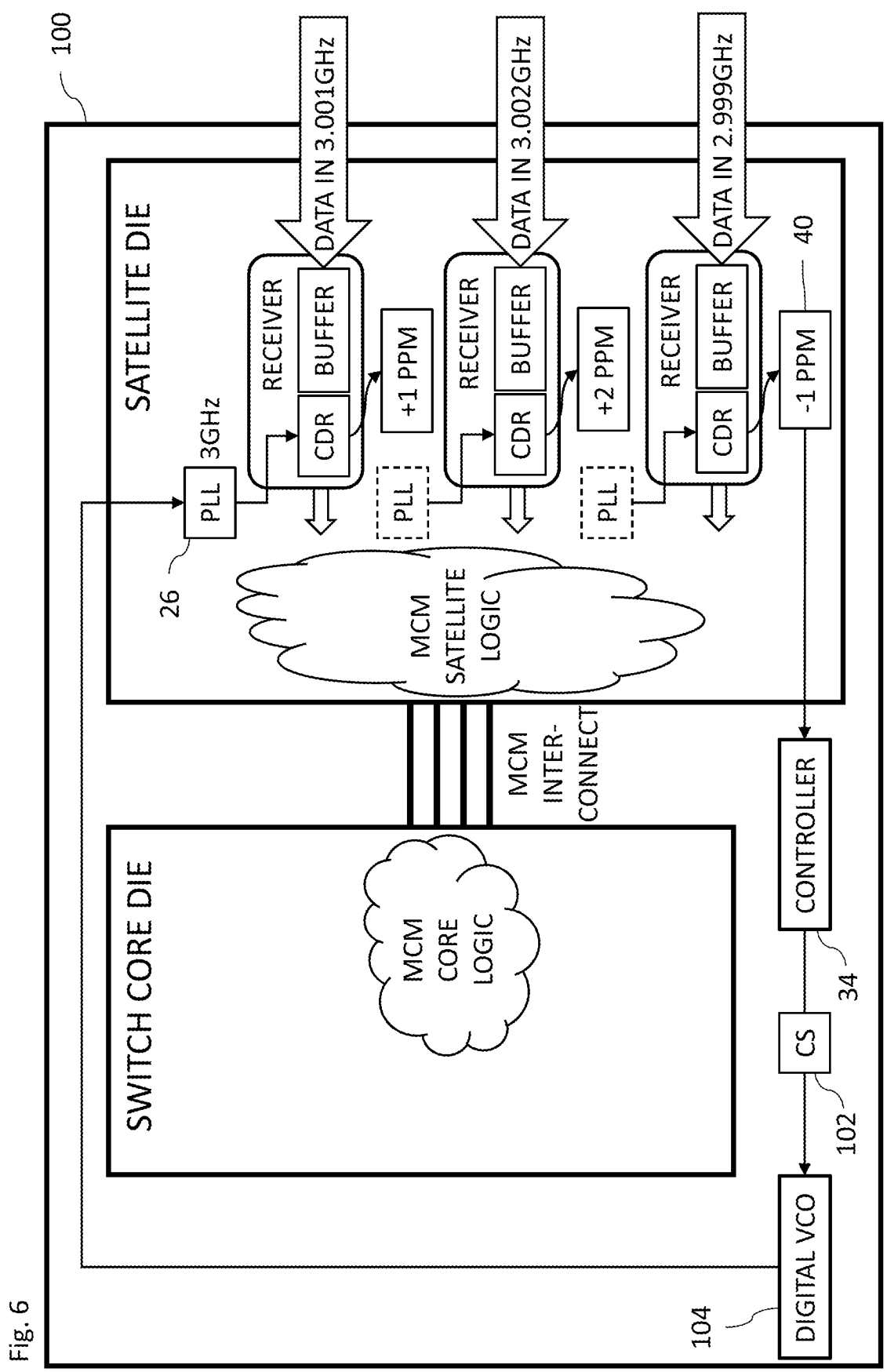
FIG. 6 is a schematic block diagram view of a network device constructed and operative in accordance with an alternative embodiment of the present invention.

Reference is now made to FIG. 6, which is a schematic block diagram view of a network device 100 constructed and operative in accordance with an alternative embodiment of the present invention. The network device 100 is substantially the same as the network device 10 of FIGS. 1-5 except for the following differences. The frequency mixer 18, shaper 20, clock cleanup PLL 22, oscillator 32 and the multiplexer 36 are replaced with frequency generation circuitry including a voltage-controlled oscillator 104 which under control of controller 34 using a control signal 102 generates the clock signal. Prior to the master clock being designated by the network management function, the controller 34 is configured to control the voltage-controlled oscillator 104 to generate a clock signal with any suitable frequency, e.g., 1.56 MHz. Once the master clock has been designated by the network management function, the controller 31 is configured to adjust the dock signal generated by the voltage-controlled oscillator 104 using the control signal 102 based on the clock differential 40 between the recovered remote clock (designated as the master clock) and the local clock generated by the PLL 26.

Figure 7:
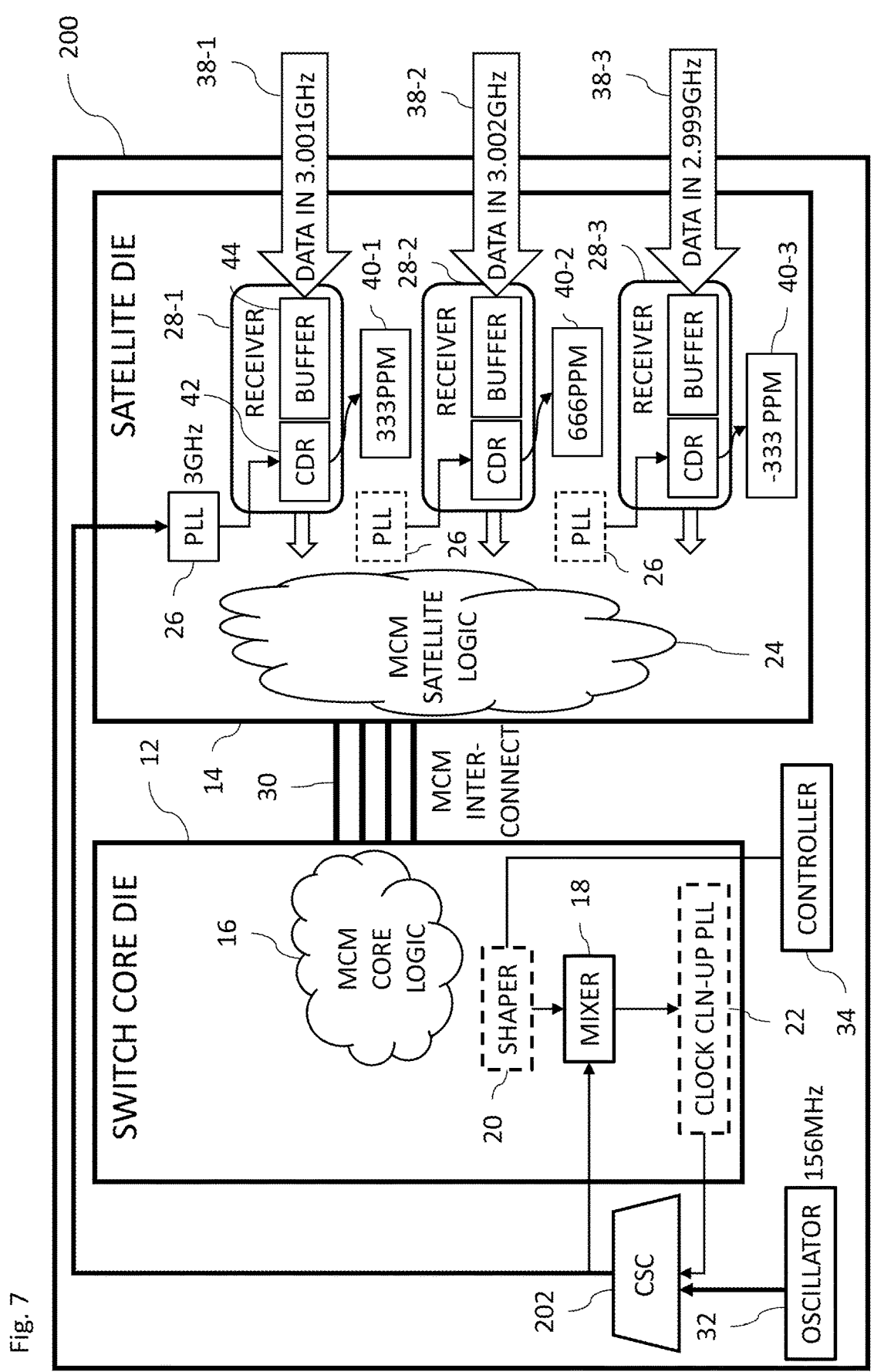
FIG. 7 is a schematic block diagram view of a network device constructed and operative in accordance with another alternative embodiment of the present invention.

Reference is now made to FIG. 7, which is a schematic block diagram view of a network device 200 constructed and operative in accordance with another alternative embodiment of the present invention. The network device 200 is substantially the same as the network device 10 of FIGS. 1-5 except for the differences described below with reference to FIGS. 7-10.

The network device 200 includes the switch core die 12 and the satellite die 14. The switch core die 12 includes multi-chip module (MCM) core logic 16. The switch core die 12 also includes the frequency mixer 18, and optionally includes the shaper 20 and the clock cleanup PLL 22. In some embodiments the frequency mixer 18, the shaper 20 and/or the clock cleanup PLL 22 may be implemented off of the main dies of the network device 200. The frequency mixer 18, the shaper 20 and the clock cleanup PLL 22 are described in more detail with reference to FIGS. 8-10.

The satellite die 11 includes the MCM satellite logic 21 to perform receiving and transmission functions of the network device 200. The satellite die 11 may also include the PLL 26 and the receivers 28 and connections to a plurality of ports (not shown). The receivers 28 have been labelled individually as 28-1, 28-2 and 28-3 for the sake of simplified reference. The switch core die 12 and the satellite die 14 are generally connected using the MCM interconnect 30.

The network device 200 may also include the oscillator 32, the controller 34, and clock switching circuitry (CSC) 202. The controller 34 is described in more detail with reference to FIGS. 8-10. The oscillator 32 and the frequency mixer 18 form part of frequency generation circuitry of the network device 200.

Although the network device 200 has been described with reference to a multi-die network switch, embodiments of the present invention may be implemented on any suitable network switch including one or more dies or any suitable network device, for example, but not limited to a network router with one or more dies.

The oscillator 32 is configured to generate a clock signal. The oscillator 32 may be a crystal oscillator or any other suitable oscillator. The frequency of the clock signal may be any suitable frequency. In the example of FIG. 7, the frequency of the clock signal generated by the oscillator is 156 MHz. Inputs of the clock switching circuitry 202 are connected to outputs of the oscillator 32 and the frequency mixer 18 (optionally via the clock clean up PLL 22). The output of the clock switching circuitry 202 is connected to the PLL 26 and to one of the inputs of the frequency mixer 18, The clock switching circuitry 202 is configured to switch between: connecting the output (i.e. clock signal) of the oscillator 32 to the PLL 26; and connecting the output (i.e. clock signal) of the frequency mixer 18 to the PLL 26 yielding a closed feedback loop with the frequency mixer 18. If the frequency mixer 18 provides a stable clock signal, the clock switching circuitry 202 connects the output of the frequency mixer 18 to the PLL 26 by default. When the frequency mixer 18 does not provide a stable clock signal (e.g., the signal includes too much jitter or too much frequency drift), the clock switching circuitry 202 connects the output of the oscillator 32 to the PLL 26. The oscillator 32 acts as a fallback clock signal when a stable clock signal is not provided by the frequency mixer 18, as will be described in more detail with reference to FIG. 8. Initially, on booting of the network device 200, the clock switching circuitry 202 connects the Output of the oscillator 32 to the PLL 26, and once the frequency mixer 18 provides a stable clock signal, the output of the frequency mixer 18 (which now includes the previous output of the oscillator) is connected to the PLL 26. If the clock signal output by the frequency mixer 18 subsequently becomes unstable, the clock switching circuitry 202 reverts to connecting the clock signal of the oscillator 32 to the PLL 26.

The clock switching circuitry 202 may include any suitable clock switching circuitry, for example, a jitter attenuator or "glitch-free" clock switching circuitry.

The PLL 26 is configured to generate a local clock based on the received clock signal. The local clock generated by the PLL 26 may be in the GHz range. In the example of FIG. 7, the PLL 26 has generated a local clock with a frequency of 3 GHz. The local clock is generally used by all the ports and lanes of the network device 200.

The receivers 28 are configured to receive and buffer (in the buffer 44) the respective data streams 38 (labeled 38-1 to 38-3) from respective remote clock sources (not shown). For the sake of simplicity only one of the buffers 44 has been labeled in FIG. 7. Each receiver 28 may be implemented using any suitable hardware such as a Serializer/Deserializer (SerDes), for example, but not limited to, an LR SerDes RX. The data in the data streams 38 generally arrives from the remote clock sources without a clock value. Each receiver 28 may include the clock and data recovery (CDR) process 42 running therein to recover a remote clock from its received data stream 38, for example based on transitions in the data of the received data stream 38, For the sake of simplicity only, one clock and data recovery (CDR) process 42 has been labeled in FIG. 7. The CDR of each receiver 28 may also compute a clock differential 40 (labeled 40-1 to 40-3), which is a difference between its recovered remote clock and the local clock (generated by the PLL 26) (e.g., the recovered remote clock less the local clock) of the network device 200 so that for each received data stream 38, a difference between the recovered remote clock of the data stream 38 and the local clock is computed. The clock differential 40 is stored in a register of the network device 200. In some embodiments, each clock differential 40 is stored in the register of the receiver 28 that computed that clock differential 40. The clock recovery may be implemented based on any suitable process, including a non-CDR based process, for example, but not limited to, using a delay-locked loop and oversampling of the data stream. The data streams 38, apart from their use in recovery of the remote clocks, generally include data for forwarding, to other devices in the network. Therefore, the data streams 38 are generally forwarded via the MCM interconnect 30 to the multi-chip module core logic 16 to perform various switching functions (or routing functions when the network device 200 is implemented as a router). The recovered clocks and the clock differentials 40 are generally not forwarded to the multi-chip module core logic 16 via the MCM interconnect 30.

FIG. 7 shows that data stream 38-1 received by the receiver 28-1 has a recovered clock of 3.001 GHz. Therefore, the clock differential 40-1 between the recovered clock of the received data stream 38-1 of 3.001 GHz and the local clock of 3 GHz is +333 PPM (i.e., the master clock is faster than the local clock by 333 PPM). The data stream 38-2 received by the receiver 28-2 has a recovered clock of 3.002 GHz. Therefore, the clock differential 40-2 between the recovered clock of the received data stream 38-2 of 3.002 GHz and the local clock of 3 GHz is +666 PPM (i.e., the master clock is faster than the local clock by 666 PPM). The data stream 38-3 received by the receiver 28-3 has a recovered clock of 2.999 GHz. Therefore, the clock differential 40-3 between the recovered clock of the received data stream 38-3 of 2.999 GHz and the local clock of 3 GHz is −333 PPM (i.e., the master clock is slower than the local clock by 333 PPM).

The example of FIG. 7 shows three receivers 28. The number of receivers 28 may be any suitable number of receivers and is not limited to three. The example of FIG. 7 shows three boxes for the PLL 26, one with a solid-line box and two with a dotted-line box. The three boxes represent the same PLL 26, which has been duplicated twice for the sake of clarity. In some embodiments, each receiver 28 or a group of receivers 28 (for example, the receivers 28 on the same IC chip) may include its/their own PLL 26.

Figure 8:
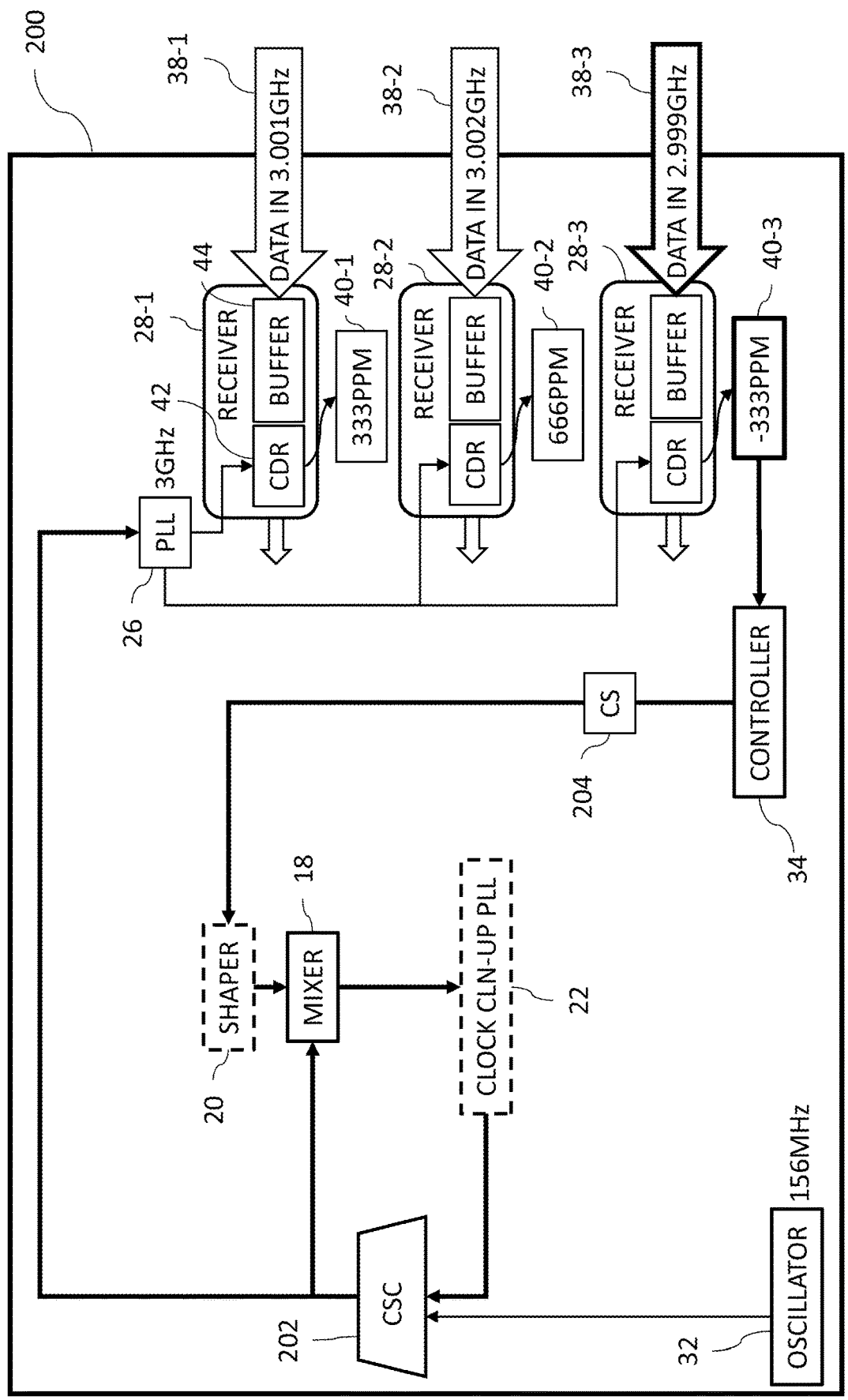
FIG. 8 is a schematic block diagram view of the network device of FIG. 7 in an initial stage of clock synchronization.

Reference is now made to FIG. 8, which is a schematic block diagram view of the network device 200 of FIG. 7 in an initial stage of clock synchronization.

Figure 9:
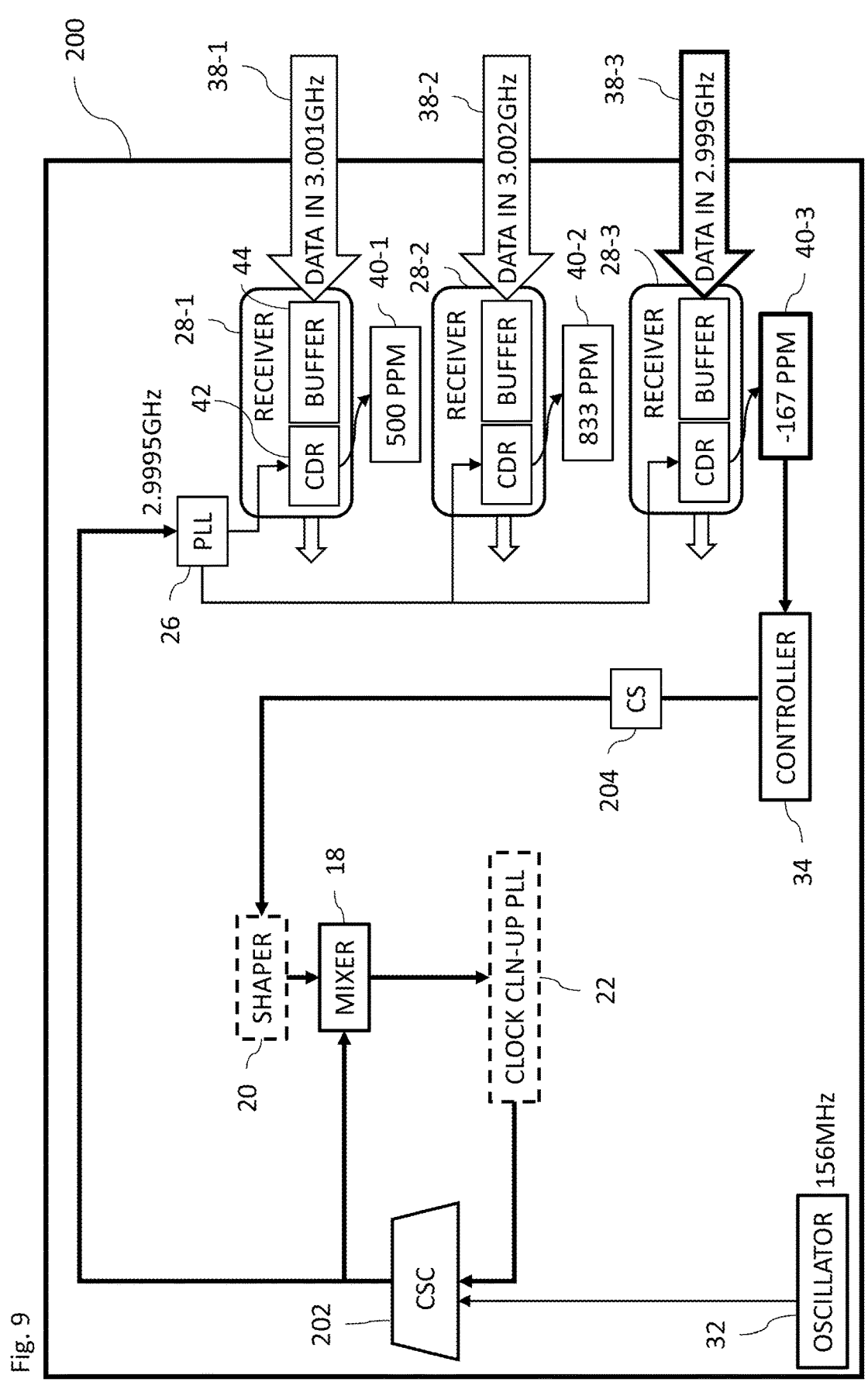
FIG. 9 is a schematic block diagram view of the network device of FIG. 7 in a later stage of clock synchronization.
Figure 10:
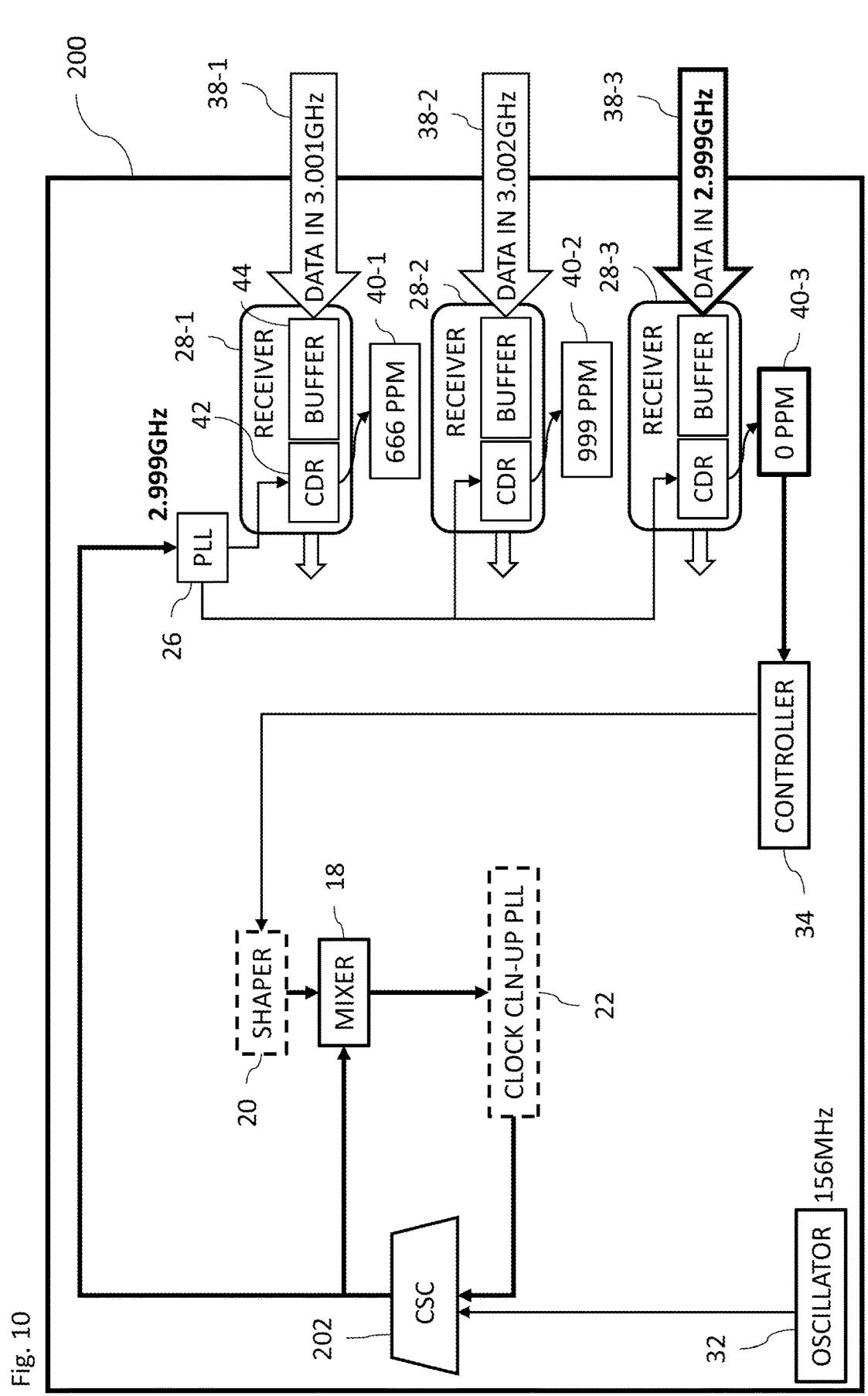
FIG. 10 is a schematic block diagram view of the network device of FIG. 7 in a final stage of clock synchronization.

Some of the elements of the network device 200 shown in FIG. 7 have not been included in FIGS. 8-10 for the sake of simplicity. At this stage, the master clock has been designated by the network management function. The designation of the master clock may be received by the controller 34. In some embodiments, the network management function may run on the controller 34 so that the controller 34 effectively designates the master clock. In the example of FIG. 8, the remote clock source generating the master clock also sends the data stream 38-3 which is received by the receiver 28-3. The frequency of the master clock is therefore equal to 2.999 GHz which is 333 PPM slower than the local clock of 3 GHz generated by the PLL 26. The adjustment of the local clock to the master clock associated with the data stream 38-3 is now described in more detail.

The controller 34 is configured to identify the remote clock recovered by one of the receivers 28 (i.e., recovered from one of the data streams 38) as a master clock. As mentioned above, in the example of FIG. 8 the identified remote clock (identified as the designated master clock) was recovered by the receiver 28-3 from the data stream 38-3.

The controller 34 is configured to find the clock differential 40-3 (e.g., −333 PPM) between the identified remote clock and the local clock generated by the PLL 26. The controller 34 may "find" the clock differential 40-3 by reading the clock differential 40-3 from a register, e.g., a register of the receiver 28-3, or by computing the clock differential 40-3 from the local clock generated by the PPL 26 and the remote clock recovered by the receiver 28-3.

The controller 34 is configured to generate a control signal 204, responsively to the clock differential 40-3, for providing to the frequency mixer 18 to slow down, or speed up, the clock signal provided to the PLL 26. In the example of FIG. 8, the local clock is faster than the master clock, therefore the control signal 204 needs to slow down the clock signal provided to the PLL 26. The controller 34 is generally configured to change the clock signal provided to the PLL 26 slowly, for example, but not limited to, by the smallest resolution possible. For example, a slow-down command may be given until the feedback indicates that the clock needs to run quicker. Then a "metastable" state is entered where the clock speed is adjusted up and down in succession, thereby indicating that the target frequency has been reached.

The controller 34 is configured to provide the control signal 204 to the frequency mixer 18 (optionally via the shaper 20). The shaper 20 delays receipt of the control signal 204 by the frequency mixer 18. The shaper 20 is described in more detail with reference to FIG. 9. In some embodiments the shaper 20 is not included in the network device 200 and delay may optionally be provided by another element, for example, within the controller 34.

The frequency mixer 18 is configured to combine the control signal 204 from the controller 34 with an output of the clock switching circuitry 202 (which in the example of FIG. 8 is currently about a 156 MHz clock signal based on the output of the oscillator 32 now incorporated in the feedback loop between the frequency mixer 18 and the clock switching circuitry 202) yielding a clock signal (which in the example of FIG. 8 is less than 156 MHz), as a combined signal, for Output towards the PLL 26 (optionally via the clock cleanup PLL 22), The clock cleanup PLL 22 is disposed between an output of the frequency mixer 18 and an input of the clock switching circuitry 202 to remove jitter from the combined signal. In some embodiments, the clock cleanup PLL 22 is not included in the network device 200.

In some embodiments, the frequency mixer 18 may be implemented with a higher speed mixer and a frequency divider to improve resolution of the mixer ticks. A mixer tick is a single mixer step in any direction. The above is now illustrated by way of an example of a frequency mixer operating at 1.56 GHz so that corrections to the output of the frequency mixer are made in a 1.56 GHz resolution so that the corrections may be more accurate. The output of the higher speed mixer is then scaled down using a frequency divider which in this example would divide the output of the mixer by 10.

Reference is now made to FIG. 9, which is a schematic block diagram view of the network device 200 of FIG. 7 in a later stage of clock synchronization.

The adjusted clock signal outputted by the frequency mixer 18 via (the clock cleanup PLL 22 and) the clock switching circuitry 202 is received by the PLL 26, The PLL 26 therefore now generates the local clock based on the adjusted clock signal generated by the frequency mixer 18 (and cleaned by the clock cleanup PLL 22), FIG. 9 shows that the control signal 204 has caused a reduction in the local clock generated by the PLL 26 from 3 GHz to 2.9995 GHz. In response to the adjustment of the local clock to 2.9995 GHz, the clock differential 40-3 computed by the clock and data recovery (CDR) process 42 of the receiver 28-3 or by the controller 34 is updated. The updated clock differential 40-3 in the example of FIG. 9 is equal to the difference between the master clock value of 2.999 GHz and the local clock value of 3 GHz, giving −167 PPM. In other words, the master clock is slower than the local clock by 167 PPM.

Therefore, the controller 34 is configured to update the control signal 204, responsively to the updated clock differential 40-3, for providing to the frequency mixer 18 to further slow-down (in the example of FIG. 9) the clock signal provided to the PLL 26. The controller 34 is configured to provide the updated control signal 204 to the frequency mixer 18 (via the shaper 20). The frequency mixer 18 is configured to combine the updated control signal 204 from the controller 34 with the output of the clock switching circuitry clock switching circuitry 202 yielding a further adjusted clock signal, as a combined signal, for output towards the PLL 26 via (the clock cleanup PLL 22 and) the clock switching circuitry 202.

If the control signal 204 performed an over adjustment of the local clock, for example, the local clock is less than the master clock, the controller 34 adjusts the control signal 204 so as to speed up the local clock.

The above process of adjusting the control signal 204 responsively to the clock differential 40-3 causing the frequency mixer 18 to adjust the clock signal is performed iteratively to reduce an absolute value of the clock differential 40-3 to below a given value.

The shaper 20, optionally disposed between the controller 34 and the frequency mixer 18 is configured to delay receipt, by the frequency mixer 18, of the control signal 204 provided by the controller 34. The delaying performed by the frequency mixer 18 attempts to prevent over correction of the clock signal and the local clock by the controller 34 as adjustments to the control signal 204 may take some time to appear in the adjusted clock signal and the adjusted local clock. The delay is generally dependent upon timing of the local clock feedback loop such as time constants of the clock switching circuitry 202, and stabilization time of the frequency mixer 18 to move to a new frequency.

Reference is now made to FIG. 10, which is a schematic block diagram view of the network device 200 of FIG. 7 in a final stage of clock synchronization.

The iterative adjustments of the control signal 204 (FIG. 9) have led to the iterative adjustments to the clock signal generated by the frequency mixer 18 and the iterative adjustments to the local clock generated by the PLL 26 so that the local clock is now equal 2.999 GHz which also equals the value of the master clock so that the clock differential 40-3 is now equal to zero. As mentioned above the PPM may need to be reduced to below a given value in order for the local clock to be considered synchronized with the master clock even if the PPM is non-zero.

Reference is now made to FIG. 5 and FIG. 8. The controller 34 is configured to identify (block 50) the remote clock recovered by one of the receivers 28 as the master clock. The controller 34 is configured to find (block 52) the clock differential 40 between the identified remote clock and the local clock.

The controller 34 is configured to check (at a decision block 54) if the absolute value of the clock differential is greater than a given value. If the absolute value of the clock differential is not greater than the given value (branch 56), then there is at present no need to synchronize the local clock with the master clock as the local clock is close enough to the master clock without performing any adjustments. If the absolute value of the clock differential is greater than, or equal to, the given value (branch 58), then the controller 34 is configured to generate (block 60) the control signal 204 described in more detail above with reference to FIGS. 8 and 9.

The controller 34 is configured to provide (block 62) the control signal 204 to the frequency mixer 18 (or any suitable frequency generation circuitry) responsively to the clock differential 40, which causes the frequency mixer 18 (or the frequency generation circuit) to adjust the clock signal so as to iteratively reduce an absolute value of the clock differential.

The steps of blocks 52-62 are repeated periodically (arrow 68), subject to a delay optionally added by the shaper 20, to perform the iterative adjustment of the clock signal and local clock described above with reference to FIGS. 8-10.

If a new master clock is designated, the controller 34 repeats the steps described above with respect to the receiver 28 of the newly assigned master clock.

Figure 11:
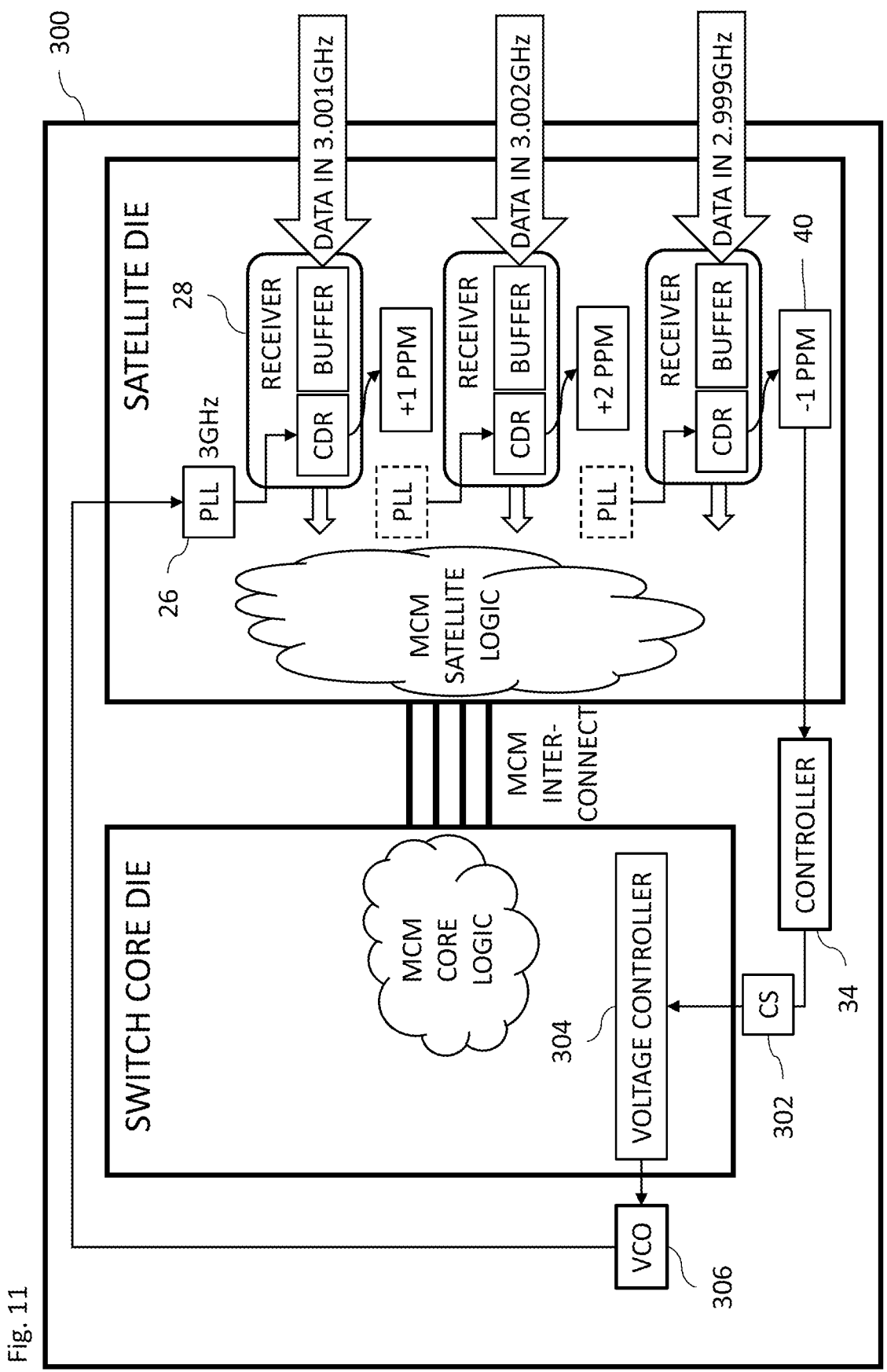
FIG. 11 is a schematic block diagram view of a network device constructed and operative in accordance with yet another alternative embodiment of the present invention.

Reference is now made to FIG. 11, which is a schematic block diagram view of a network device 300 constructed and operative in accordance with yet another alternative embodiment of the present invention.

The network device 300 is substantially the same as the network device 200 of FIGS. 7-10 except for the following differences. The frequency mixer 18, shaper 20, clock cleanup PLL 22, oscillator 32 and the clock switching circuitry 202 are replaced with frequency generation circuitry including a frequency synthesizer 306 (e.g., a digital voltage-controlled oscillator (VCO)) and a voltage controller 304.

The frequency synthesizer 306 is configured to generate the clock signal. The voltage controller 304 is configured to generate a voltage responsively to a control signal 302 generated by the controller 34. The frequency synthesizer 306 (e.g., the VCO) is configured to adjust the clock signal responsively to the generated voltage. Therefore, indirectly, the frequency synthesizer 306 is configured to adjust the clock signal responsively to the control signal.

Prior to the master clock being designated by the network management function, the controller 34 is configured to control the voltage controller 304 using the control signal 302 to generate a voltage so that the frequency synthesizer 306 generates a clock signal with any suitable frequency, e.g., 156 MHz. Once the master clock has been designated by the network management function, the controller 34 is configured to adjust the voltage output by the voltage controller 304 using the control signal 302, to adjust the clock signal generated by the frequency synthesizer 306. The control signal 302 is based on the clock differential 40 between the recovered remote clock (designated as the master clock) and the local clock generated by the PLL 26.

Figure 12:
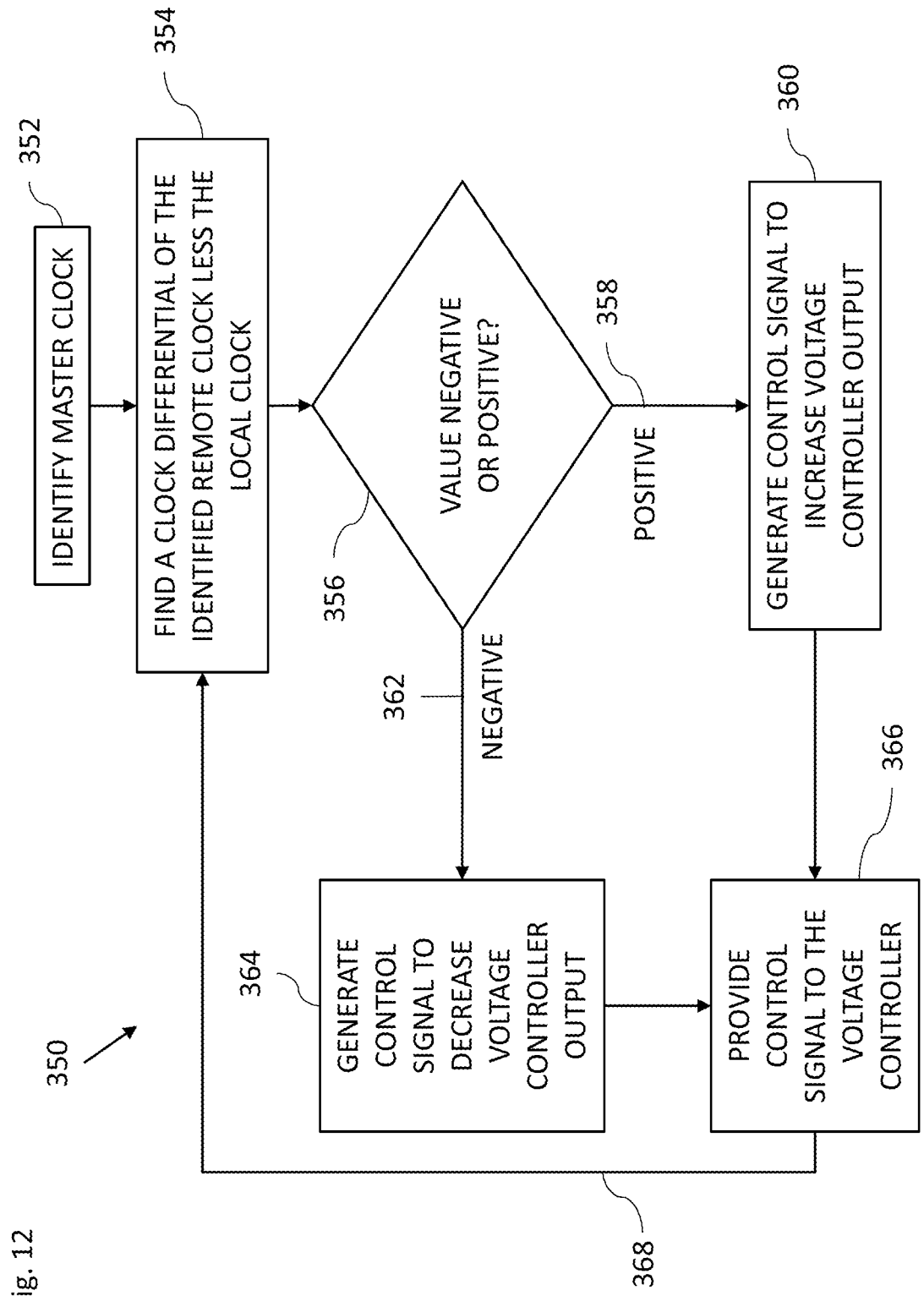
FIG. 12 is a flow chart including exemplary steps in a method of clock synchronization in the network device of FIG. 11.

Reference is now made to FIG. 12, which is a flow chart 350 including exemplary steps in a method of clock synchronization in the network device 300 of FIG. 11. Reference is also made to FIG. 11.

The controller 34 is configured to identify (block 352) the remote clock recovered by one of the receivers 28 as the master clock. The controller 34 is configured to find (block 354) the dock differential 40 of the identified remote clock less the local clock.

The controller 34 is configured to check (at a decision block 356) if the clock differential is negative (indicating that the local clock is too fast) or positive (indicating that the local clock is too slow). If the clock differential is positive (branch 358), the controller 34 is configured to generate (block 360) the control signal 302 so as to increase the voltage output by the voltage controller 304. If the clock differential is negative (branch 362), the controller 34 is configured to generate (block 364) the control signal 302 so as to decrease the voltage output by the voltage controller 304. In some embodiments, if the absolute value of the clock differential is less than a given value, the clock signal is not adjusted, as the local clock is considered to be close enough to the master clock value. The controller 34 provides (block 366) the control signal 302 to the voltage controller 304.

The steps of blocks 354-366 are repeated periodically (arrow 368) to perform the iterative adjustment of the clock signal and local clock. If a new master clock is designated, the controller 34 repeats the steps of blocks 352-368 described above with respect to the receiver 28 of the newly assigned master clock.

Figure 13:
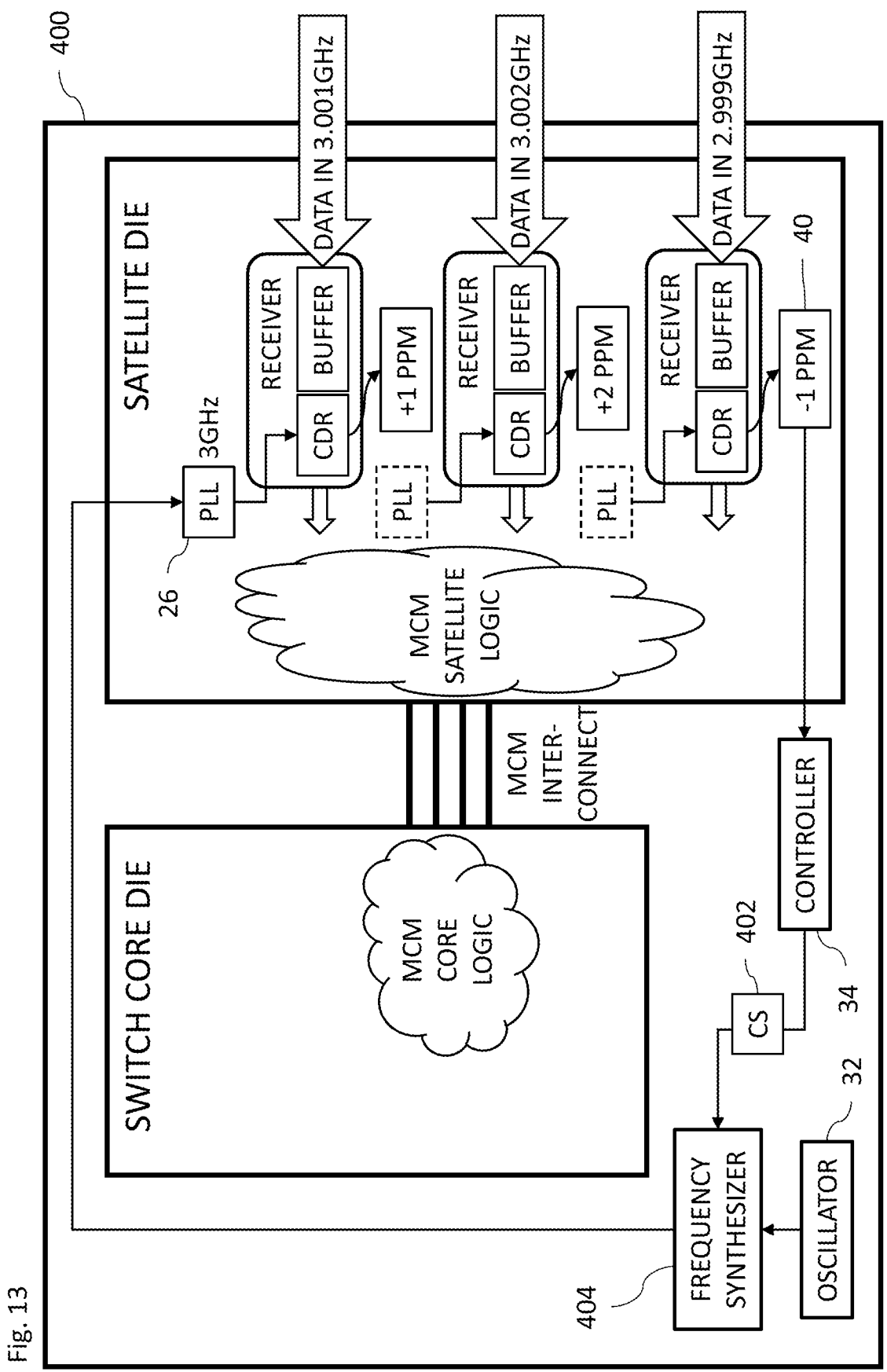
FIG. 13 is a schematic block diagram view of a network device constructed and operative in accordance with still another alternative embodiment of the present invention.

Reference is now made to FIG. 13, which is a schematic block diagram view of a network device 400 constructed and operative in accordance with still another alternative embodiment of the present invention.

The network device 400 is substantially the same as the network device 200 of FIGS. 7-10 except for the following differences. The frequency mixer 18, shaper 20, clock cleanup PLL 22, and the clock switching circuitry 202 are replaced with frequency generation circuitry including a frequency synthesizer 404 and the oscillator 32 or any other suitable oscillator.

The controller 34 is configured to provide a control signal 402 as a digital control signal responsively to a clock differential between the identified remote clock (identified as the master clock) and the local clock generated by the PLL 26. The control signal 402 may include any suitable digital control signal, for example, a control signal according to the I$^2$C (Inter-Integrated Circuit) Protocol.

The frequency synthesizer 404 is configured to generate the dock signal and adjust the clock signal responsively to the control signal. The frequency synthesizer 404 is configured to generate the clock signal responsively to an output of the oscillator 32 and the digital control signal. The clock signal is generated by adjusting the oscillator frequency according to the digital control signal.

The frequency synthesizer 404 may be implemented using any suitable frequency synthesizer, for example, a low or ultra-low frequency jitter synchronizer. An example of a suitable frequency synthesizer 404 is Ultra-Low Jitter Network Synchronizer Clock LMK05318 commercially available from Texas Instruments Inc., 12500 TI Boulevard Dallas, Tex. 75243 USA. A low frequency jitter synthesizer may include two inputs for two different clocks. In accordance with some embodiments, one of the two inputs is connected to the output of the oscillator 32 and the other one of the two inputs is connected to the controller 34 to receive the control signal 402.

When there is no control signal 402 (for example, prior to the master clock being designated by the network management function), the frequency synthesizer 404 generates the clock signal based on the clock signal provided by the oscillator 32. Once the master clock has been designated by the network management function, the controller 34 is configured to generate the control signal 402 to adjust the clock signal generated by the frequency synthesizer 404.

Figure 14:
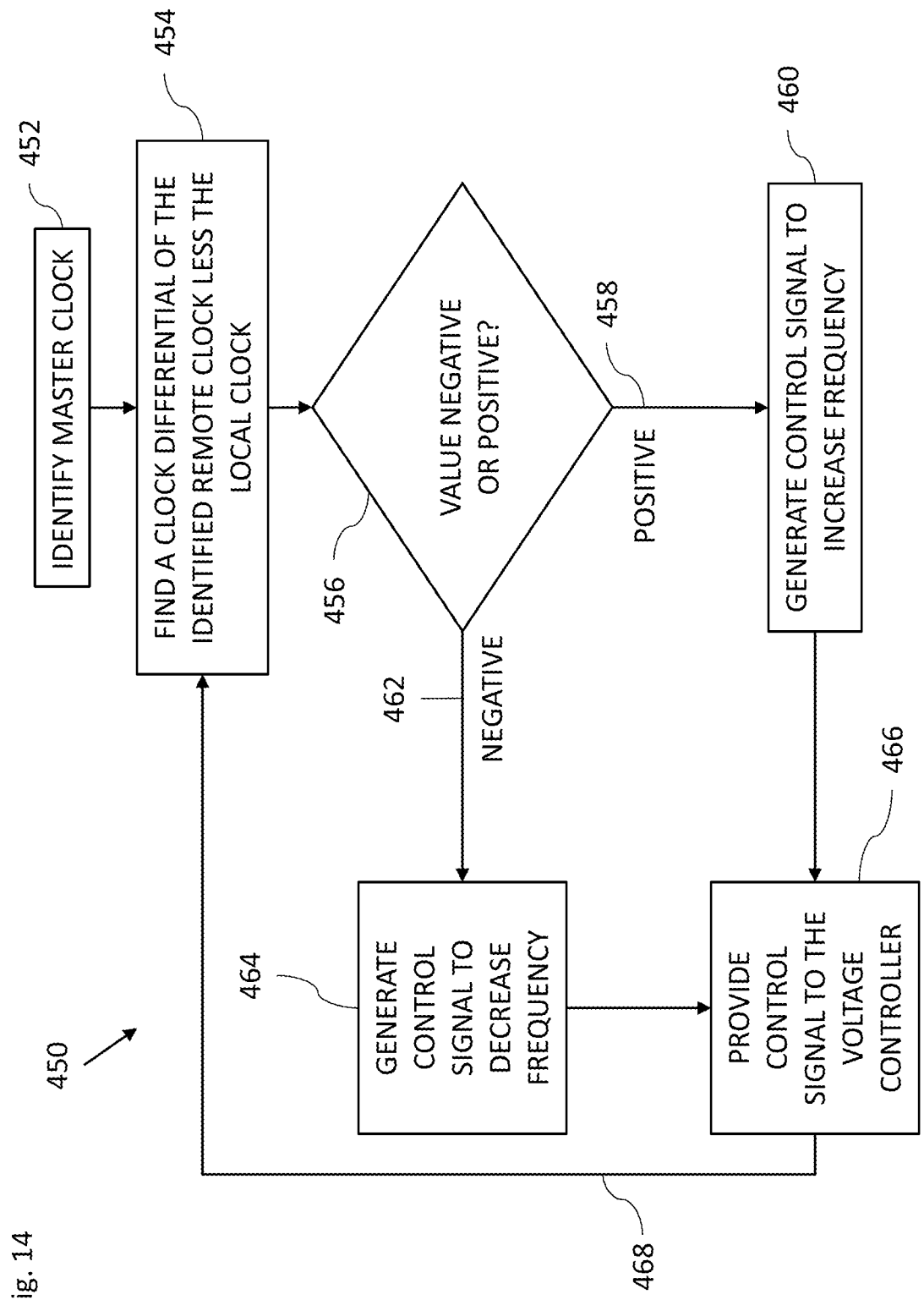
FIG. 14 is a flow chart including exemplary steps in a method of clock synchronization in the network device of FIG. 13.

Reference is now made to FIG. 14, which is a flow chart 450 including exemplary steps in a method of clock synchronization in the network device 400 of FIG. 13.

The controller 34 is configured to identify (block 452) the remote clock recovered by one of the receivers 28 as the master clock. The controller 34 is configured to find (block 454) the clock differential 40 of the identified remote clock less the local clock.

The controller 34 is configured to check (at a decision block 456) if the clock differential is negative (indicating that the local clock is too fast) or positive (indicating that the local clock is too slow). If the clock differential is positive (branch 458), the controller 34 is configured to generate (block 460) the control signal 402 so as to increase the frequency of the clock signal generated by the frequency synthesizer 404. If the clock differential is negative (branch 462), the controller 34 is configured to generate (block 464) the control signal 402 so as to decrease the frequency of the clock signal generated by the frequency synthesizer 404. In some embodiments, if the absolute value of the clock differential is less than a given value, the clock signal is not adjusted, as the local clock is considered to be close enough to the master clock value. The controller 34 provides (block 466) the control signal 402 to the frequency synthesizer 404. The control signal 402 is generally provided to cause the frequency synthesizer 404 to adjust the clock signal and does not generally need to be provided to keep the clock signal at a steady frequency.

The steps of blocks 454-466 are repeated periodically (arrow 468) to perform the iterative adjustment of the clock signal and local clock. If a new master clock is designated, the controller 34 repeats the steps of blocks 452-468 described above with respect to the receiver 28 of the newly assigned master clock.

Figure 15:
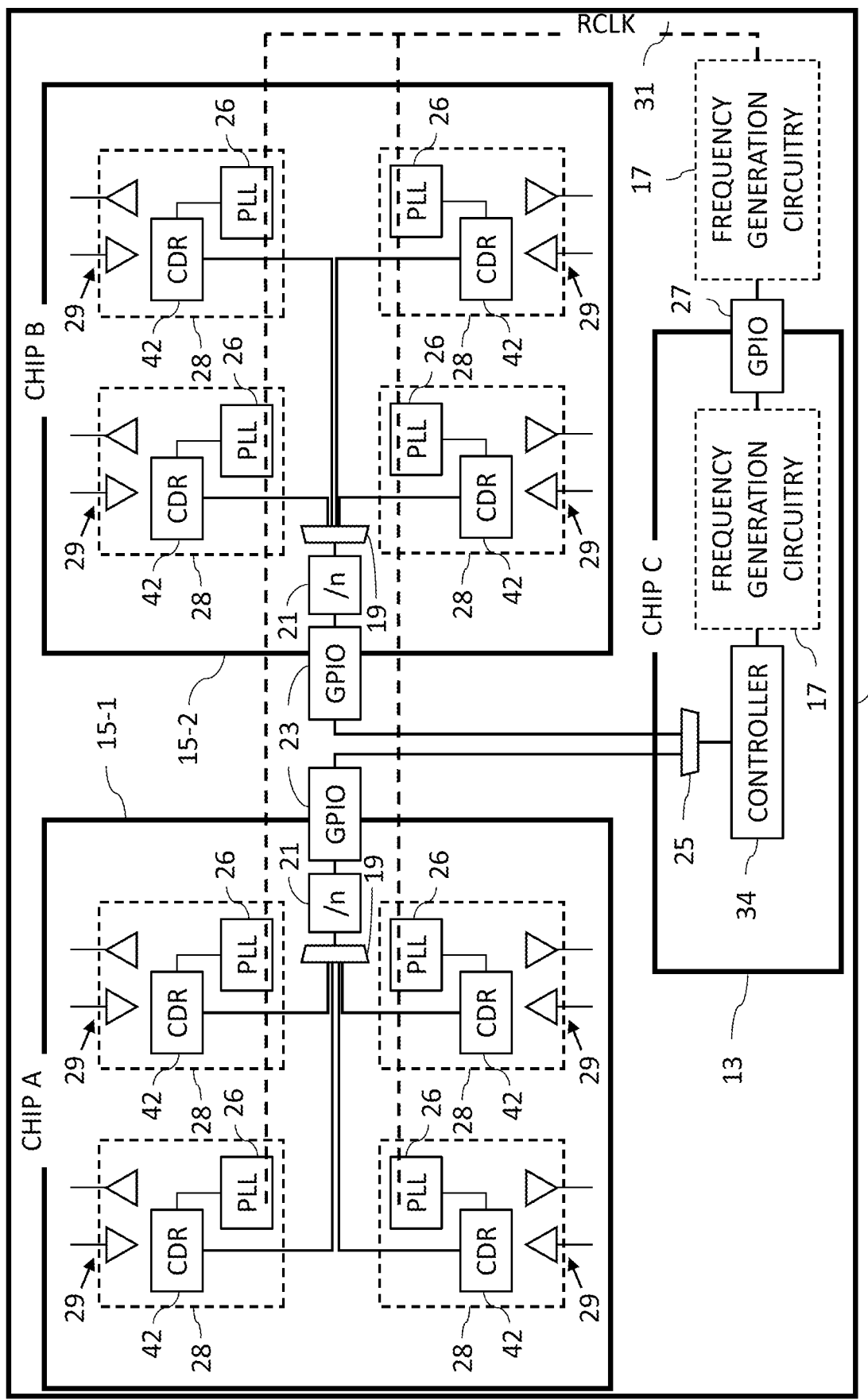
FIG. 15 is a schematic block diagram view of a network device constructed and operative in accordance with yet another alternative embodiment of the present invention.

Reference is now made to FIG. 15, which is a schematic block diagram view of a network device 500 constructed and operative in accordance with yet another alternative embodiment of the present invention.

The network device 500 includes multiple integrated circuit (IC) chips 13, 15. The network device 500 may include two or more of the IC chips 15 and at least one IC chip 13. Only two different IC chips 15, IC chip 15-1 ("Chip A") and IC chip 15-2 ("Chip B"), are shown in FIG. 15 for the sake of simplicity.

Each IC chip 15 includes a group of the receivers 28. For example, IC chip 15-1 includes a group of the receivers 28 and IC chip 15-2 includes a group of the receivers 28. Each receiver 28 includes circuitry to run the clock and data recovery (CDR) process 42, and the PLL 26. Each receiver 28 may be implemented using any suitable hardware such as a Serializer/Deserializer (SerDes) 29, for example, but not limited to, an LR SerDes RX. In some embodiments, two or more receivers 28 may share a PLL, for example, one PLL 26 per chip 15 may be shared by the receivers 28 of that chip 15.

The outputs from the clock and data recovery (CDR) process 42 of each receiver 28 of each IC chip 15 are combined in a multiplexer 19 (each IC chip 15 having its own multiplexer 19), and processed in a divider 21 (each IC chip 15 having its own divider 21), and output via a general-purpose input/output (GPIO) 23 (each IC chip 15 having its own GPIO 23) towards the IC chip 13. The IC chip 13 includes a multiplexer 25, which combines the outputs received from the GPIOs 23 of the IC chips 15, for output to the controller 34 on the IC chip 13. The controller 34 finds the clock differential according to any suitable method, for example, one of the methods described hereinabove. The controller 34 then outputs one or more control signals to frequency generation circuitry 17 to generate the clock signal. The frequency generation circuitry 17 may be disposed on the IC chip 13 and/or in any other suitable location. FIG. 15 shows that the frequency generation circuitry 17 is partially disposed on the IC chip 13 and partially disposed off of the IC chip 13. The frequency generation circuitry 17 may include any suitable combination of components to generate and adjust the clock signal, for example, but not limited to, any one or more of the following: clock switching circuitry 202, oscillator 32, voltage controller 304, frequency synthesizer 306, and/or frequency synthesizer frequency synthesizer 404 described hereinabove.

The IC chip 13 is connected to off chip components, and/or other the chips 15 via a GPIO 27. The generated clock is fed back to the PLLs 26 on the IC chips 15 via a suitable connection 31 (shown using a dashed line).

In practice, some or all of the functions of the controller 34 may be combined in a single physical component or, alternatively, implemented using multiple physical components. These physical components may comprise hard-wired or programmable devices, or a combination of the two. In some embodiments, at least some of the functions of the controller 34 may be carried out by a programmable processor under the control of suitable firmware. This firmware may be downloaded to a device in electronic form, over a network, for example. Alternatively, or additionally, the software may be stored in tangible, non-transitory computer-readable storage media, such as optical, magnetic, or electronic memory.

The software components of the present invention may, if desired, be implemented in ROM (read only memory) form. The software components may, generally, be implemented in hardware, if desired, using conventional techniques. The software components may be instantiated, for example: as a computer program product or on a tangible medium. In some cases, it may be possible to instantiate the software components as a signal interpretable by an appropriate computer, although such an instantiation may be excluded in certain embodiments of the present invention.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and subcombinations of the various features described hereinabove, as well as variations and modifications thereof which would occur to persons skilled in the art upon reading the foregoing description and which are not disclosed in the prior art.

What is claimed is:

1. A device comprising:
frequency generation circuitry configured to generate a clock signal;
a phase-locked loop (PLL) configured to generate a local clock based on the clock signal;
a receiver configured to receive a data stream from a remote clock source and recover a remote clock from the data stream; and
a controller configured to:
find a clock differential between the local clock and the remote clock identified as a master clock; and
provide a control signal to the frequency generation circuitry responsively to the clock differential, which causes the frequency generation circuitry to adjust the clock signal so as to iteratively reduce an absolute value of the clock differential between the local clock and the remote clock identified as the master clock so that the local clock generated by the PLL is synchronized with the master clock.

2. The device according to claim 1, wherein the frequency generation circuitry comprises:
an oscillator;
clock switching circuitry; and
a frequency mixer configured to combine the control signal from the controller with an output of the switching circuitry to generate the clock signal as a combined signal for output towards the PLL, wherein the clock switching circuitry is configured to switch between: connecting an output of the oscillator to the PLL; and connecting an output of the frequency mixer to the PLL yielding a closed feedback loop with the frequency mixer.

3. The device according to claim 2, further comprising a clock clean-up PLL disposed between the output of the frequency mixer and an input of the switching circuitry to remove jitter from the combined signal.

4. The device according to claim 2, further comprising a shaper disposed between the controller and the frequency mixer to delay receipt, by the frequency mixer, of the control signal provided by the controller.

5. The device according to claim 1, wherein the frequency generation circuitry comprises a frequency synthesizer configured to generate the dock signal, and adjust the clock signal responsively to the control signal.

6. The device according to claim 5, wherein:
the frequency generation circuitry comprises a voltage controller configured to generate a voltage responsively to the control signal; and
the frequency synthesizer comprises a voltage-controlled oscillator, which is configured to adjust the clock signal responsively to the generated voltage.

7. The device according to claim 5, wherein:
the frequency generation circuitry comprises an oscillator;
the controller is configured to provide the control signal as a digital control signal responsively to the clock differential; and
the frequency synthesizer is configured to generate the clock signal responsively to an output of the oscillator and the digital control signal.

8. The device according to claim 7, wherein the frequency synthesizer is a frequency jitter synchronizer.

9. The device according to claim 8, wherein the frequency jitter synchronizer includes a first input connected to the output of the oscillator and a second input connected to an output of the controller.

10. The device according to claim 7, wherein the frequency synthesizer is a jitter network synchronizer clock.

11. A clock synchronization method, comprising:
generating a dock signal;
generating a local dock based on the clock signal;
receiving a data stream from a remote clock source;
recovering a remote clock from the data stream;
finding a clock differential between the local clock and the remote clock identified as a master clock; and
providing a control signal responsively to the clock differential, the clock signal causing adjustment of the clock signal so as to iteratively reduce an absolute value of the clock differential between the local clock and the remote clock identified as the master clock so that the local clock generated by the PLL is synchronized with the master clock.

12. The method according to claim 11, further comprising:
combining the control signal with an output of switching circuitry in a frequency mixer to generate the clock signal as a combined signal; and
switching by the switching circuitry between: connecting an output of an oscillator to a phase-locked loop (PLL); and connecting an output of the frequency mixer to the PLL yielding a closed feedback loop with the frequency mixer.

13. The method according to claim 12, further comprising removing jitter from the combined signal.

14. The method according to claim 12, further comprising delaying receipt of the control signal.

15. The method according to claim 11, further comprising:
providing a frequency synthesizer;
generating the clock signal by the frequency synthesizer; and
adjusting the clock signal responsively to the control signal.

16. The method according to claim 15, further comprising:
generating a voltage responsively to the control signal; and
adjusting the clock signal responsively to the generated voltage.

17. The method according to claim 15, further comprising:
providing the control signal as a digital control signal responsively to the clock differential; and
generating the clock signal responsively to an output of an oscillator and the digital control signal.

18. The method according to claim 17, wherein the frequency synthesizer is a frequency jitter synchronizer.

19. The method according to claim 17, wherein the frequency synthesizer is a jitter network synchronizer clock.

* * * * *